United States Patent [19]

Toguchi

[11] Patent Number: 5,764,169
[45] Date of Patent: Jun. 9, 1998

[54] CODING METHOD AND APPARATUS

[75] Inventor: Akira Toguchi, Daito, Japan

[73] Assignee: Sanyo Electric Co., Ltd., Moriguchi, Japan

[21] Appl. No.: 648,005

[22] PCT Filed: Sep. 27, 1995

[86] PCT No.: PCT/JP95/01951

§ 371 Date: Jul. 24, 1996

§ 102(e) Date: Jul. 24, 1996

[87] PCT Pub. No.: WO96/10255

PCT Pub. Date: Apr. 4, 1996

[30] Foreign Application Priority Data

Sep. 28, 1994 [JP] Japan .................. 6-232593

[51] Int. Cl.[6] .................................. G11B 20/14
[52] U.S. Cl. .................................. 341/68; 341/58
[58] Field of Search .................... 341/58, 59, 68, 341/69

[56] References Cited

U.S. PATENT DOCUMENTS 5,432,651  7/1995  Maeno et al. ..................... 360/41
5,579,182  11/1996 Hamai et al. ..................... 360/41

FOREIGN PATENT DOCUMENTS 5-284035 A  10/1993  Japan.
6-131822 A  5/1994  Japan.

*Primary Examiner*—Jeffrey A. Gaffin
*Assistant Examiner*—Peguy JeanPierre
*Attorney, Agent, or Firm*—Armstrong, Westerman, Hattori, McLeland, & Naughton

[57] ABSTRACT

An encoder includes a control bit insertion circuit (12) for inserting a control bit into input data, which is then subjected to I-NRZ modulation by a precoder (14) to generate a reference code. The reference code is given to a 4-code generation circuit (22) through a delay circuit (16), and frequency components of the reference code, and first, second and third codes generated on the basis of the reference code are detected by a frequency detector (18). The frequency components are given to a judge circuit (20) such that it is determined whether the frequency components are large or small. A judge signal is applied to the 4-code generation circuit and a frequency detector from the judge circuit. The 4-code generation circuit selectively outputs one selected from the reference code and the first to third codes on the basis of the judgement signal.

9 Claims, 27 Drawing Sheets

FIG.1(A)

MSB (INSERTION BIT)

INPUT DATA a : <u>0</u> 1 0 1 1 0 0 0 1 1 0 1 0 1 1 0 0 1 1 1 1 0 0 1 1

MODULATION SIGNAL   <u>0 0</u> 0 1 0 0 1 0 1 0 0 1 0 0 0 1 1 1 1 0 0 1 1 1 1

CODE A 0 : 0 1 0 0 1 0 1 0 0 1 0 0 0 1 1 1 1 0 0 1 1 1 <u>0 0</u>

FIG.1(B)

MSB (INSERTION BIT)

INPUT DATA a : <u>1</u> 1 0 1 1 0 0 0 1 1 0 1 0 1 1 0 0 1 1 1 1 0 0 1 1

MODULATION SIGNAL   <u>0 0</u> 1 1 1 0 0 0 0 0 1 1 1 0 1 1 0 1 0 0 1 1 0 1 0

CODE A 1 : 1 1 1 0 0 0 0 1 1 1 0 1 1 0 1 0 0 1 1 0 1 0 <u>0 1</u>

FIG.2(A)

| INPUT DATA b | 0 1 0 1 1 0 0 0 1 1 0 1 0 1 1 0 0 1 1 1 1 0 0 1 1 |
|---|---|
| MODULATION SIGNAL | 0 0 0 1 0 0 1 0 1 0 0 1 0 0 0 1 1 1 1 0 0 1 1 1 1 |
| CODE B 0 | : 0 1 0 0 1 0 1 0 0 1 0 0 0 1 1 1 1 0 0 1 1 1 0 0 |

FIG.2(B)

| INPUT DATA b | 1 1 0 1 1 0 0 0 1 1 0 1 0 1 1 0 0 1 1 1 1 0 0 1 1 |
|---|---|
| MODULATION SIGNAL | 0 0 1 1 1 0 0 0 0 1 1 1 0 1 1 0 1 0 0 1 1 0 1 0 |
| CODE B 1 | : 1 1 1 0 0 0 0 1 1 1 0 1 1 0 1 0 0 1 1 0 1 0 0 1 |

FIG.2(C)

| INPUT DATA b | 0 1 0 1 1 0 0 0 1 1 0 1 0 1 1 0 0 1 1 1 1 0 0 1 1 |
|---|---|
| MODULATION SIGNAL | 0 1 0 0 0 1 1 1 1 0 0 0 1 0 0 1 0 1 1 0 0 1 0 1 |
| CODE B 2 | : 0 0 0 1 1 1 1 0 0 0 1 0 0 1 0 1 1 0 0 1 0 1 1 0 |

FIG.2(D)

| INPUT DATA b | 1 1 0 1 1 0 0 0 1 1 0 1 0 1 1 0 0 1 1 1 1 0 0 1 1 |
|---|---|
| MODULATION SIGNAL | 0 1 1 0 1 1 0 1 0 1 1 0 1 1 1 0 0 0 0 1 1 0 0 0 0 |
| CODE B 3 | : 1 0 1 1 0 1 0 1 1 0 1 1 1 0 0 0 0 1 1 0 0 0 0 1 1 |

F I G. 13
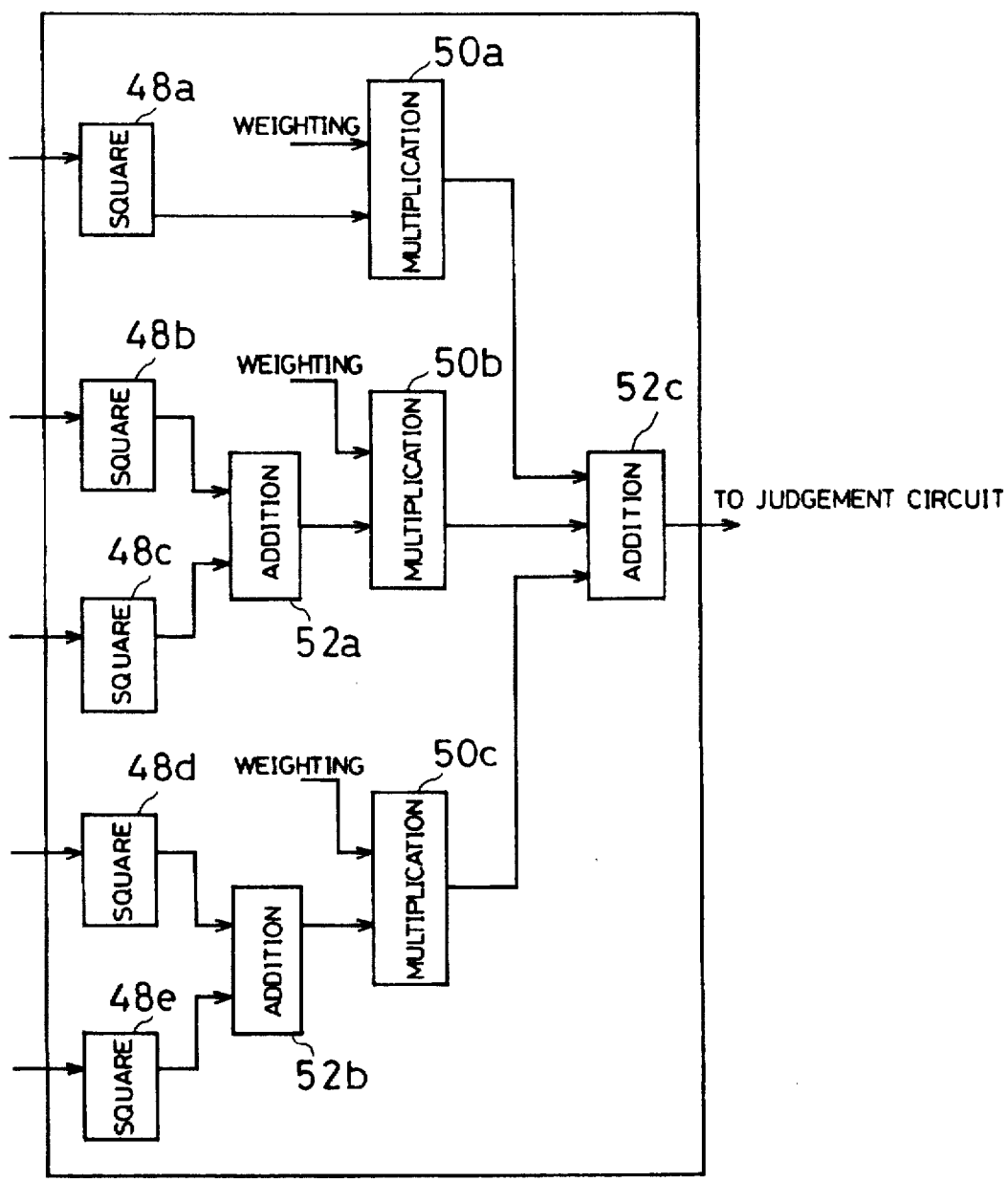

F I G. 14
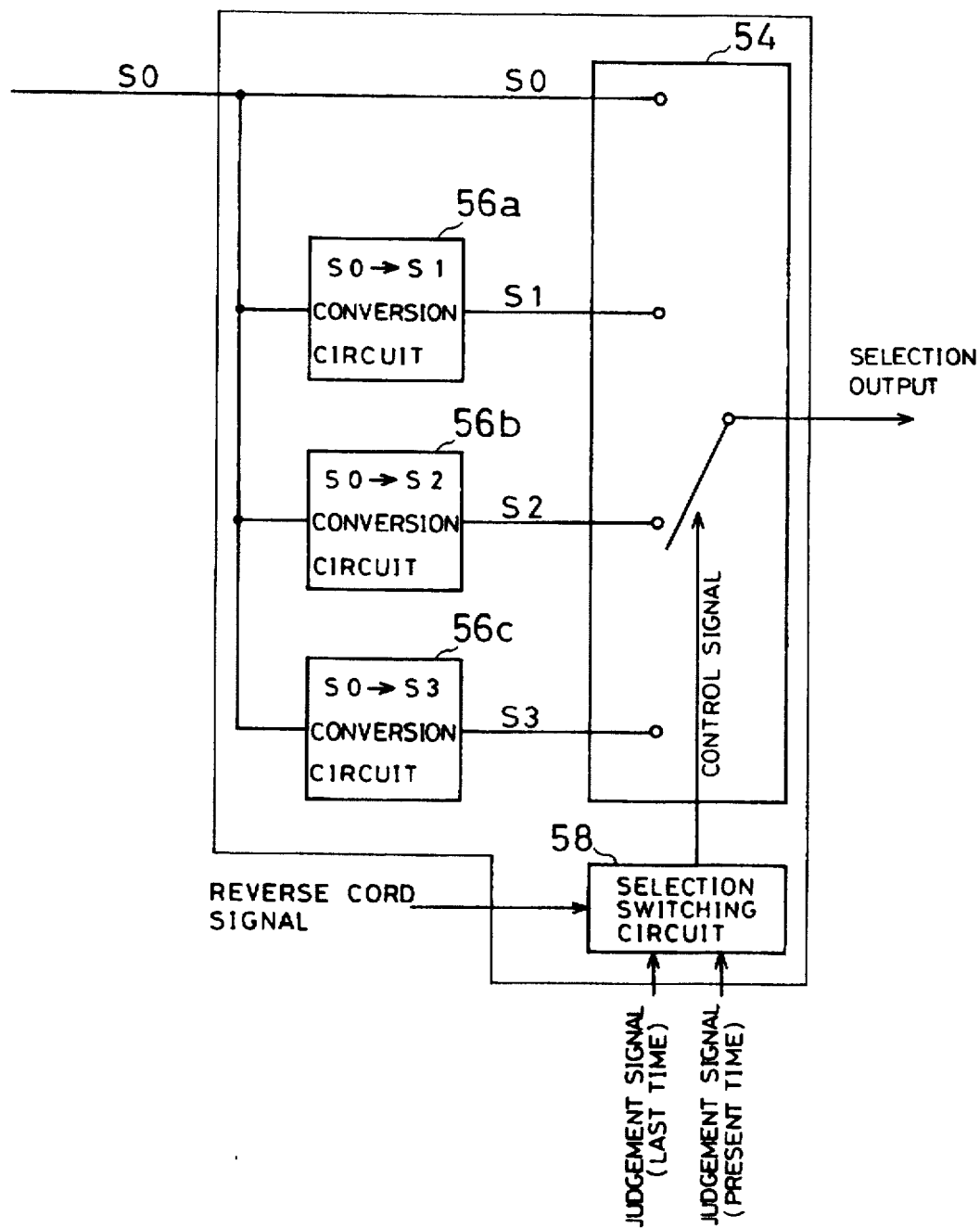

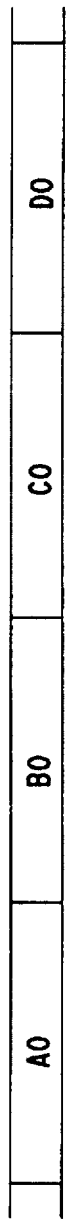
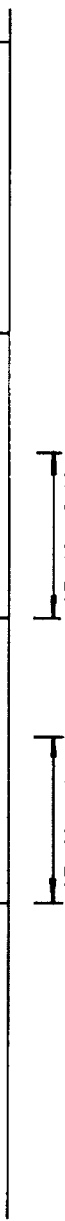
FIG.15(A) OUTPUT OF PRECODER
FIG.15(B) OUTPUT OF HOLD CIRCUIT
FIG.15(C) OUTPUT OF JUDGEMENT CIRCUIT
FIG.15(D) OUTPUT OF 4-CODE GENERATION CIRCUIT

F I G.16

RUN-A : 000111000111000001 1100011
RUN-B : 1110001110001111100011100

FIG.17(A)

```
                    INSERTED 2 BITS
                          ↓
INPUT DATA           |0 0| 0 1 1 0 1 1 0 1 1 0 1 1 0 0 0 1 1 0 1 1 0 1 1
MODULATION SIGNAL     0 0  0 0 0 1 1 1 0 0 0 1 1 1 0 0 0 0 0 1 1 1 0 0 0
REFERENCE CODE S0    :0 0  0 1 1 1 0 0 0 1 1 1 0 0 0 0 0 1 1 1 0 0 0 1 1
  (RUN-A)
```

FIG.17(B)

```
                    INSERTED 2 BITS
                          ↓
INPUT DATA           |0 1| 0 1 1 0 1 1 0 1 1 0 1 1 0 0 0 1 1 0 1 1 0 1 1
MODULATION SIGNAL     0 1  0 0 0 1 1 1 0 0 0 1 1 1 0 0 0 0 0 1 1 1 0 0 0
REFERENCE CODE S0    :0 0  0 1 1 1 0 0 0 1 1 1 0 0 0 0 0 1 1 1 0 0 0 1 1
  (RUN-A)
```

FIG.17(C)

```
                    INSERTED 2 BITS
                          ↓
INPUT DATA           |1 0| 0 1 1 0 1 1 0 1 1 0 1 1 0 0 0 1 1 0 1 1 0 1 1
MODULATION SIGNAL     1 0  0 0 0 1 1 1 0 0 0 1 1 1 0 0 0 0 0 1 1 1 0 0 0
REFERENCE CODE S0    :0 0  0 1 1 1 0 0 0 1 1 1 0 0 0 0 0 1 1 1 0 0 0 1 1
  (RUN-A)
```

FIG.17(D)

```
                    INSERTED 2 BITS
                          ↓
INPUT DATA           |1 1| 0 1 1 0 1 1 0 1 1 0 1 1 0 0 0 1 1 0 1 1 0 1 1
MODULATION SIGNAL     1 1  0 0 0 1 1 1 0 0 0 1 1 1 0 0 0 0 0 1 1 1 0 0 0
REFERENCE CODE S0    :0 0  0 1 1 1 0 0 0 1 1 1 0 0 0 0 0 1 1 1 0 0 0 1 1
  (RUN-A)
```

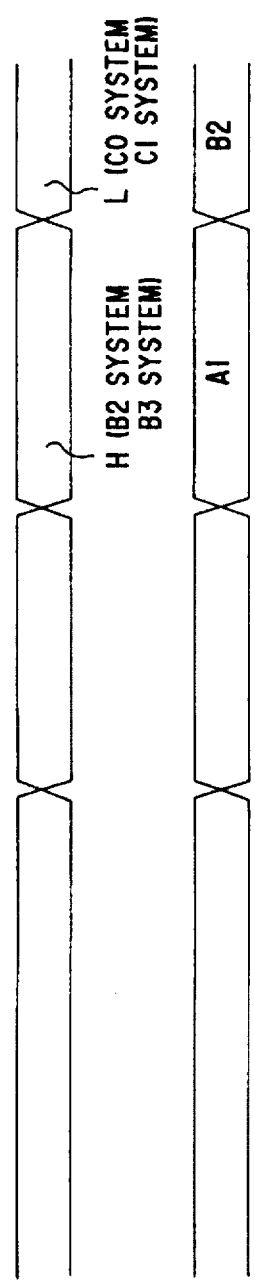

CODING METHOD AND APPARATUS

FIELD OF THE INVENTION

The present invention relates to a coding method and apparatus. More specifically, the present invention realtes to a coding method and apparatus used for a VTR, VCR, and etc. adopting a digital pilot signal recording system so as to convert input data to which a control bit is added at a head into an output code.

PRIOR ART

One example of conventional such a kind of coding apparatus is disclosed in, for example, Japanese Patent Application Laying-open No. 4-255969 [G11B20/14, H03M7/30] laid-open on Sep. 10, 1992. In the prior art, frequency components of two kinds of codes obtained by inserting a control bit of "0" or "1" at a head of input data of N+1 bits and by subjecting the same to I-NRZ modulation, and an appropriate code is selectively outputted through comparison of processed results, and last two bits of a selected code to a precoder for the I-NRZ modulation of next input data.

Since in such a prior art coding apparatus, the last two bits of the output code are fed-back, it is necessary to process preceding input data within a time that the input data equal to one code is modulated, e.g. a time period of 25 clocks in a case where one code is 25 bits so as to output the appropriate code, it is difficult to put the coding apparatus into practical use. More specifically, since a frequency component extraction circuit performs Fourier transform for a DC component and components of frequencies f1 and f2 in a modulated code, a circuit becomes quite large and a processing time for the extraction of the frequency components becomes long, it is quite difficult to shorten a time period to extract the frequency components for one bit in comparison with a time period for the I-NRZ modulation of one bit data, therefore, and accordngly, it is difficult to put the coding apparatus into practical use.

SUMMARY OF THE INVENTION

Therefore, a principal object of the present invention is to provide a novel coding mathod.

Another object of the present invention is to provide a coding method in which it is unnecessary to feed-back a portion of a preceding code.

A further object of the present invention is to provide a coding apparatus which implements the above described coding method.

According to the present invention, a coding method comprises steps of: (a) inserting a control bit into input data; (b) generating a reference code on the basis of input data into which the control bit is inserted; (c) generating a predetermined number of associate codes on the basis of the reference code; and (d) selectively outputting one of the reference code and the associate codes on the basis of frequency components of the reference code and the associate codes.

According to the present invention, a coding apparatus comprises: insertion means (12) for inserting a control bit into input data; reference code generation means (14) for generating a reference code on the basis of data outputted from the insertion means; associate code generation means (22, 56a, 56b, 56c) for generating a predetermined number of associate codes being in correlation with the reference code on the basis of the reference code; judgment signal output means (18, 20) for outputting a judgment signal on the basis of frequency components of the reference code and the associate codes; and code output means (22, 54) for selectively outputting one of the reference code and the associate codes according to the judgment signal.

In accordance with the present invention, since the associate codes are generated in advance on the basis of the reference code, and one code is selectively outputted on the basis of the frequency components of these codes, it is unnecessary to feed-back last two bits of a preceding output code, and therefore, a time restriction is released, and accordingly, it is possible to certainly convert the input data into the code.

In one embodiment, the judgment signal output means includes first to N-th extraction means for extracting first to N-th (N is an integer) frequency components of each of the reference codes and the associate codes, first to N-th calculation means for calculating each of the first to N-th frequency components, and outputting first to $2^M$-th (M is a positive integer) calculation results, and first to $2^M$-th operation means for operating each of the first to $2^M$-th calculation results outputted from the first to N-th calculating means.

In a case where frequency components are processed at every one code (in a case where M=1), frequency components of the reference code and a first to third codes (the associate codes) generated on the basis of the reference code are extracted by frequency component extraction circuits, two of these frequency components are applied to a first and second component addition circuits included in, for example, a DC component extraction circuit. Then, the first addition circuit functions as first, second, third and fourth addition means, and the second addition circuit functions as fifth, sixth, seventh and eighth addition means in accordance with a change-over switch, for example. Therefore, the frequency components are added each other, and outputs of the first addition circuit and the second addition circuit are outputted from a DC component calculation circuit as the first calculation result and the second calculation result. These process is executed in the other calculation circuits, e.g. f1 sine component extraction circuit, f1 cosine component extraction circuit, f2 sine component extraction circuit and f2 cosine component extraction circuit. Then, the first calculation result and the second calculation result outputted from the calculation circuits are operated by a first square waiting addition circuit and a second square waiting addition circuit, respectively, and the operation results are applied to the judgment circuit. The judgment circuit judges sizes of the operation results, and outputs a judgment signal according to the sizes. The reference code is converted into a predetermined output code by, for example, a 4-code generation circuit according to the judgment signal.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 1 is an illustrative view showing an operation of an I-NRZ modulation.

FIG. 2 is an illustrative view showing an operation of the I-NRZ modulation;

FIG. 13 is a block diagram showing a portion of FIG. 4 embodiment;

FIG. 14 is a block diagram showing a portion of FIG. 4 embodiment;

FIG. 15(A) is an illustrative view showing an output of a precoder, FIG. 15(B) is an illustrative view showing an output of a hold circuit, FIG. 15(C) is an illustrative view showing an output of a judgment circuit, and FIG. 15(D) is an illustrative view showing an output of a 4-code generation circuit;

FIG. 16 is an illustrative view showing a portion of the operation of FIG. 4 embodiment;

FIG. 17 is an illustrative view showing a portion of the operation of FIG. 4 embodiment;

FIG. 27(A) is an illustrative view showing an output of a precoder, FIG. 27(B) is an illustrative view showing an output of a hold circuit, FIG. 27(C) is an illustrative view showing an output of a judgment circuit, and FIG. 27(D) is an illustrative view showing an output of a 4-code generation circuit.

BEST MODE FOR EMBODYING THE INVENTION

Figure 3:
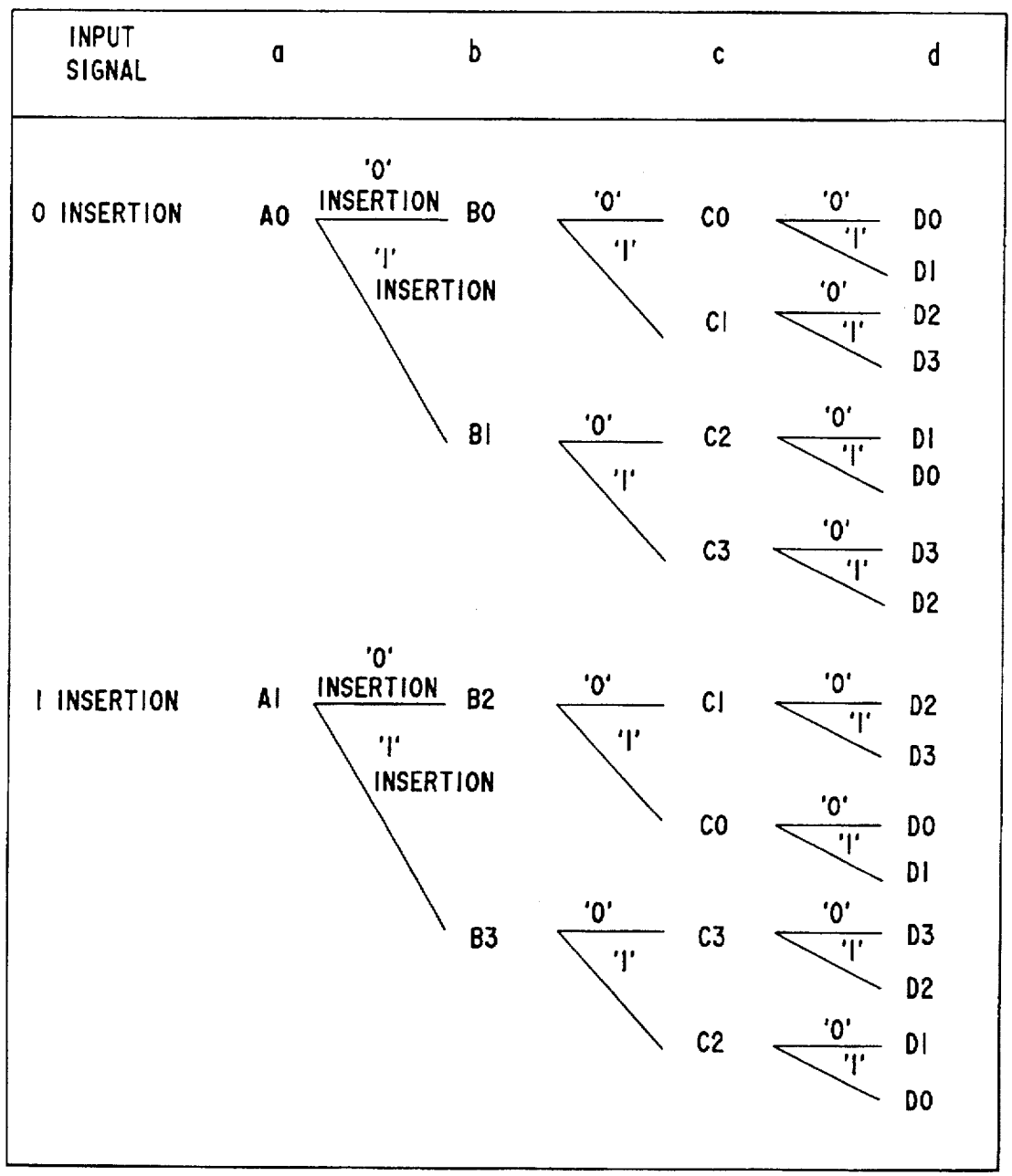
FIG. 3 is an illustrative view showing an operation of the I-NRZ modulation.

An embodiment described in the following utilizes facts that the number of the kinds of codes generated in claim by inserting "0" or "1" as a control bit into input data and subjecting to I-NRZ modulation is always limited to four (4) for the same input data, and that the four kinds of codes have a specific relationship to each other can be generated from one kind of code, and that there is a predetermined rule in the relationship of the four kinds of codes.

The facts will be described with referring to FIG. 1 and FIG. 2. As shown in FIG. 1(A) and FIG. 1(B), in a code A0 obtained by inserting "0" as the control bit into input data "a" of 24 bits and subjecting inserted data to the I-NRZ modulation and a code A1 obtained by inserting "1" as the control bit into the input data "a" and subjecting inserted data to the I-NRZ modulation, bits of odd numbers of the codes A0 and A1 have an inverted relationship. This means that second bits in the last two bits of each code have the inverted relation. The last two bits become first two bits of a modulation signal used for the next I-NRZ modulation. Furthermore, as understood from FIG. 2(A) and FIG. 2(C), in a code B0 obtained by inserting "0" into succeeding 24 bits of input data "b" and subjecting inserted data to the I-NRZ modulation at a time that a preceding code is a code obtained by inserting "0" (the last two bits are "00") and a code B2 obtained by inserting "0" into succeeding input data "b" and subjecting inserted data to the I-NRZ modulation at a time that a preceding code is a code obtained by inserting "1" (the last two bits are "01") bits of even numbers of the codes B0 and B2 have the inverted relationship.

Furthermore, as understood from FIG. 2(B) and FIG. 2(D), in a code B1 obtained by inserting "1" into succeeding input data "b" and subjecting inserted data to the I-NRZ modulation at a time that a preceding code is a code obtained by inserting "0" and a code B3 obtained by inserting "1" into succeeding input data "b" and subjecting inserted data to the I-NRZ modulation at a time that a preceding code is a code obtained by inserting "1", bits of even number of the codes B1 and B3 have the inverted relationship.

Furthermore, as understood from FIG. 2(A) and FIG. 2(D), all bits of the codes B0 and B3 have the inverted relation in the code B0 obtained by inserting "0" into succeeding input data "b" and subjecting inserted data to the I-NRZ modulation at a time that a preceding code is a code obtained through the "0" insertion and the code B3 obtained by inserting "1" into succeeding input data "b" and subjecting inserted data to the I-NRZ modulation at a time that a preceding code is a code obtained through the "1" insertion.

In the following description, a code obtained by inserting "0" as the control bit and subjecting to the I-NRZ modulation is regarded as a reference code S0 (or an S0 code), a code that odd number bits have the inverted relation to with respect to odd number bits of the S0 code is regarded as an S1 code, a code that even number bits have the inverted relation with respect to even number bits of the S0 code is regarded as an S2 code, and a code that all bits have the inverted relation to all bits of the S0 code is regarded as an S3 code. Since this relation is the same in the last two bits of the S0 code to the S3 code, a result obtained by inserting "0" into 24 bits following the S0 code and subjecting to the modulation and a result obtained by inserting "1" into 24 bits following the S2 code and subjecting to the modulation become the same, and a result obtained by inserting "1" into 24 bits following the S0 code and subjecting to the modulation and a result obtained by inserting "0" into 24 bits following the S2 code and subjecting to the modulation become the same. Furthermore, a result obtained by inserting "0" into 24 bits following the S1 code and subjecting to the modulation and a result obtained by inserting "1" into 24 bit following the S3 code and subjecting to the modulation are the same, and a result obtained by inserting "1" into 24 bits following the S1 code and subjected to the modulation and a result obtained by inserting "0" into 24 bits following the S3 code and subjecting to the modulation are the same.

That is, as a result that three data sequentially inputted are subjected to the I-NRZ modulation in chain, eight (8) codes can be obtained at a third time; however, it is finally no more than that two couples of four kinds of codes can be obtained. Codes which can be obtained in a following data chain are always limited to four kinds of codes S0 to S3 defined in the above description. Furthermore, codes linked to the S0 code or the S2 code are the S0 code and the S1 code in the four kinds of codes, and codes linked to the S1 code or the S3 code are the S2 code and the S3 code.

Accordingly, in the four kinds of code obtained by subjecting an input data train, a code obtained by inserting "0" as the control bit and subjecting to the I-NRZ modulation is regarded as a reference code A0 (or an A0 code), a code that odd number bits have the inverted relationship to that of the A0 code is regarded as an A1 code, a code that even number bits have the inverted relationship to that of the A0 code is regarded as an A2 code, and a code that all bits have the inverted relationship to that of the A0 code is regarded as an A3 code, and if coefficients of "0" to "3" are to be added to sides of B, C, D in the same manner in succeeding input data "b", "c"and "d", chain relationship of the codes are shown in FIG. 3.

An embodiment described in the following is an embodiment in which a time restriction during in processing frequency components as in the prior art can be removed because it is possible to estimate the four kinds of codes from one kind of code and the chain relationship between a preceding code and a succeeding code is known in advance.

In the following, a case that the input data is processed at every one code (a case of M=1) and a case that the input data is processed at every two codes having the chain relationship will be described with assuming that a period necessary for an operation for extracting a frequency component is 25 clocks and that a period necessary for an operation of calculation and judgment following the extraction operation is 15 clocks. First, the case that the input data is processed at every one code is described.

Figure 4:
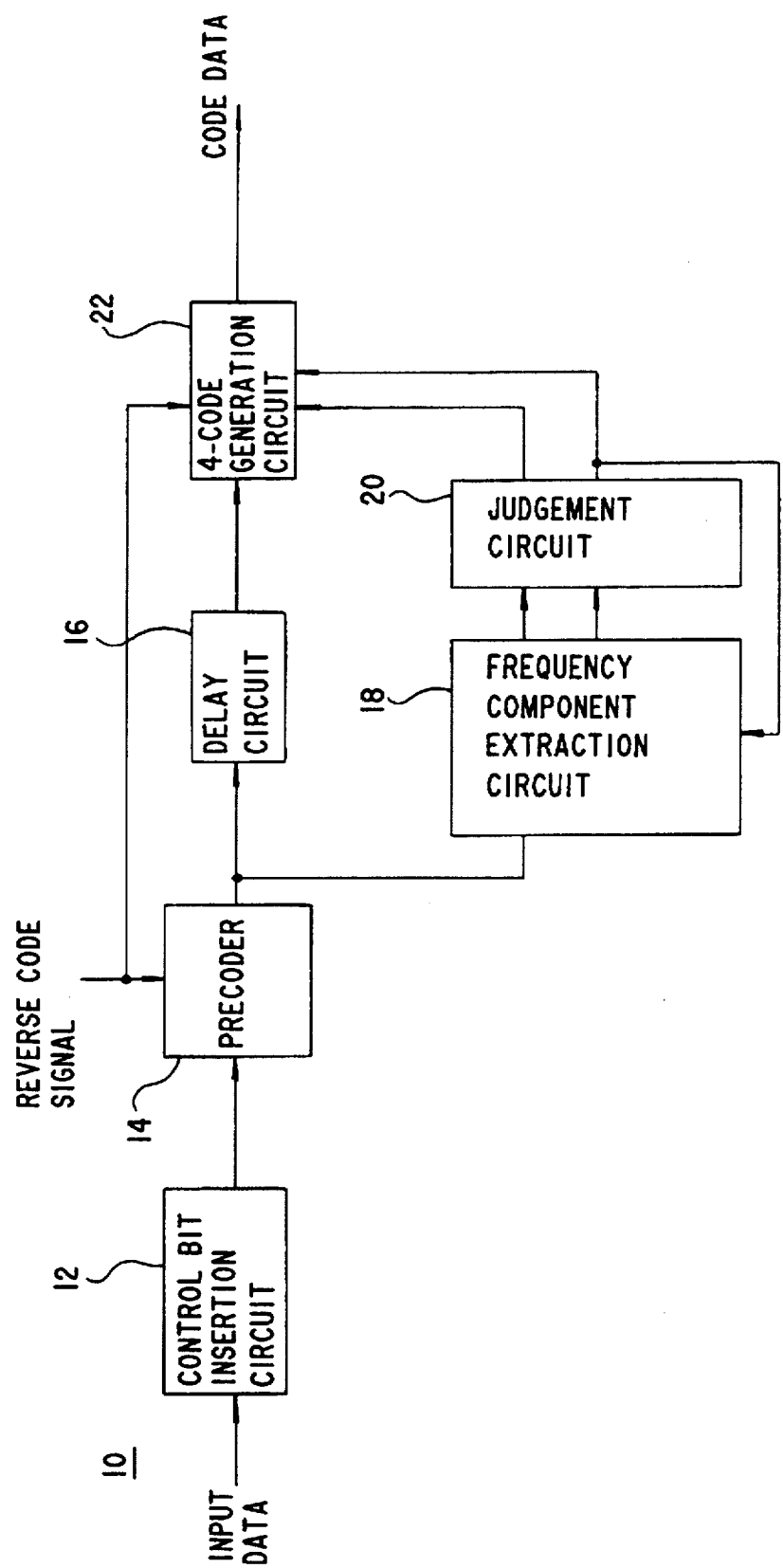
FIG. 4 is a block diagram showing one embodiment according to the present invention.

With referring to FIG. 4, a coding apparatus 10 of this embodiment includes a control bit insertion circuit 12 by which the control bit "0" of 1 bit is inserted into the input data of 24 bits. Data into which the control bit is inserted is then subjected to the I-NRZ modulation in a precoder 14, whereby the reference code S0 is generated. In addition, an inverted code signal is inputted into the precoder 14, and an operation of the precoder 14 is changed in accordance with a level of this signal.

The reference code S0 outputted from the precoder 14 is succeedingly applied to a delay circuit 16 and a frequency component extraction circuit 18. The frequency component extraction circuit 18 generates the S0 code to the S3 code on the basis of the reference code S0, and outputs frequency component extraction results of two codes in the S0 code to the S3 code on the basis of a judgment result of the preceding or last code. The judgment circuit 20 judges the extraction result smaller than the other result, and outputs a judgment signal of a high level or a low level in response to a judgment result for a 4-code generation circuit 22 and the frequency component extraction circuit 18. In addition, a judgment signal according to the preceding or last judgment is also outputted from the judgment circuit 20 to the 4-code generation circuit 22 simultaneously.

The reference code S0 inputted into the delay circuit 16 is delayed for a time period (40 clocks) till the judgment selection signal is outputted from the judgment circuit 20, and then applied to the 4-code generation circuit 22. The 4-code generation circuit 22 selects to output a desired code out of the reference code S0 and the S1 code to the S3 code generated according to the code S0. In addition, an inverted code signal is also applied to the 4-code generation circuit 22, whereby an operation of the 4-code generation circuit 22 is changed. An outputted code is recorded into a magnetic tape 60 (FIG. 18) as described later.

Figure 5:
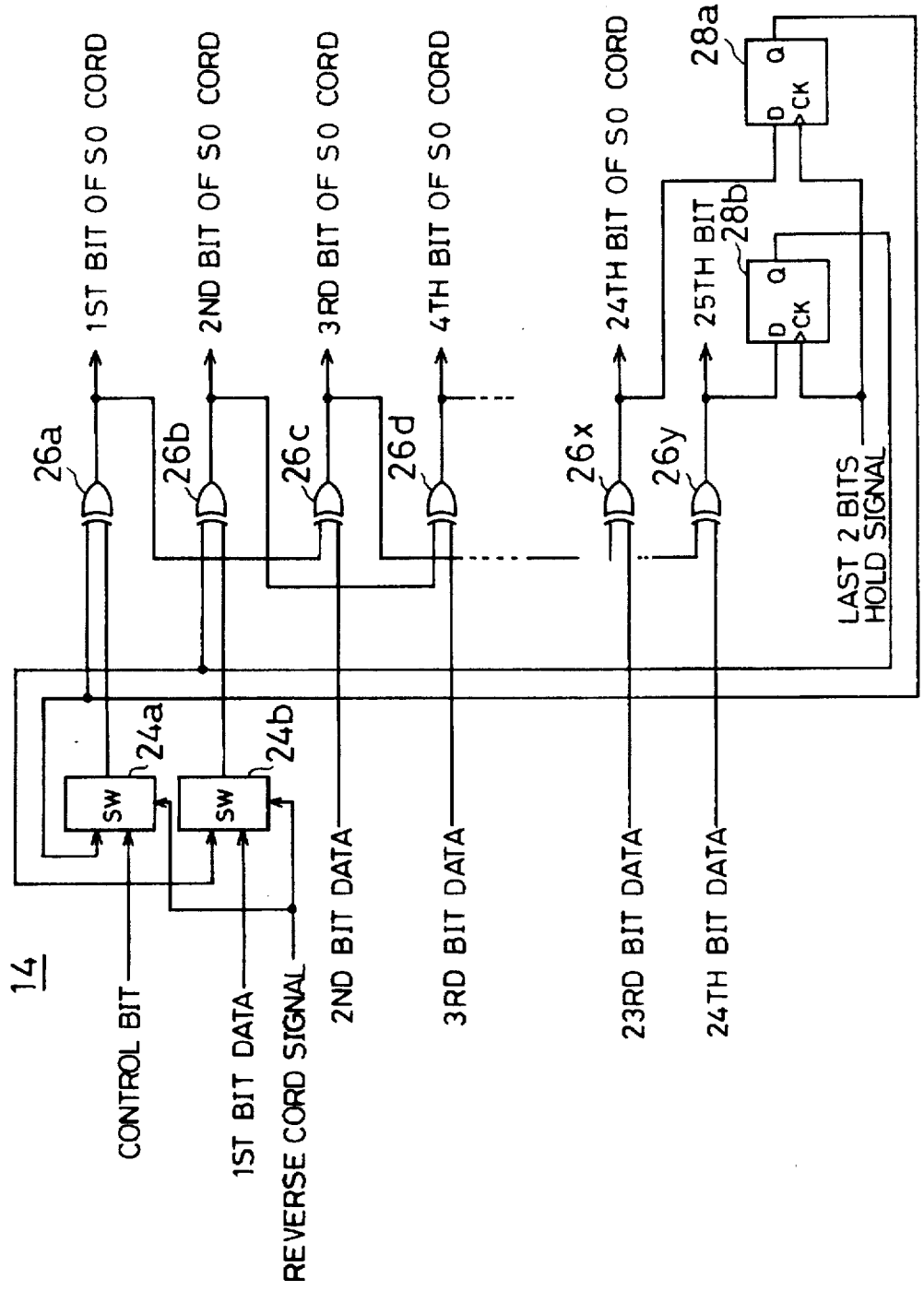
FIG. 5 is a block diagram showing a portion of FIG. 4 embodiment.

Constitution of the precoder 14 is shown in FIG. 5. The control bit and a first bit of the input data into which the control bit is inserted is inputted to one terminals of switches 24a and 24b each of which is controlled by the inverted code signal, and a second bit to a twenty-fourth bit of the input data are applied to one terminals of EXOR circuits 26c to 26y, respectively. Furthermore, output signals from latch circuits 28a and 28b outputs of which are controlled by a last two bits hold signal are applied to other terminals of the switches 24a and 24b, respectively. Then, the control bit and the first bit of the input data are outputted from the switches 24a and 24b when the inverted code signal is a low level, and the outputs of the latch circuit 28a and 28b are outputted therefrom when the inverted code signal is a high level, and then, the outputs are applied to the one terminals of the EXOR circuits 26a and 26b, respectively. A first bit of the reference code S0 is applied to the other terminal of the EXOR circuit 26c, and a second bit of the reference code S0 is applied to the other terminal of the EXOR circuit 26d. In the same manner, each of the outputs of the EXOR circuits is applied to the other terminal of each of the EXOR circuits for a bit two bits later till the EXOR circuit 26x. However, output bits of the EXOR circuits 26x and 26y are latched by the latch circuits 28a and 28b, respectively, and outputs thereof are controlled in accordance with the last two bits hold signal. In addition, the inverted code signal becomes a low level when the input data is normal data, and the inverted code signal becomes a high level when the input data is particular data used for a synchronization signal area, an overwrite margin area, and etc.

Figure 6:
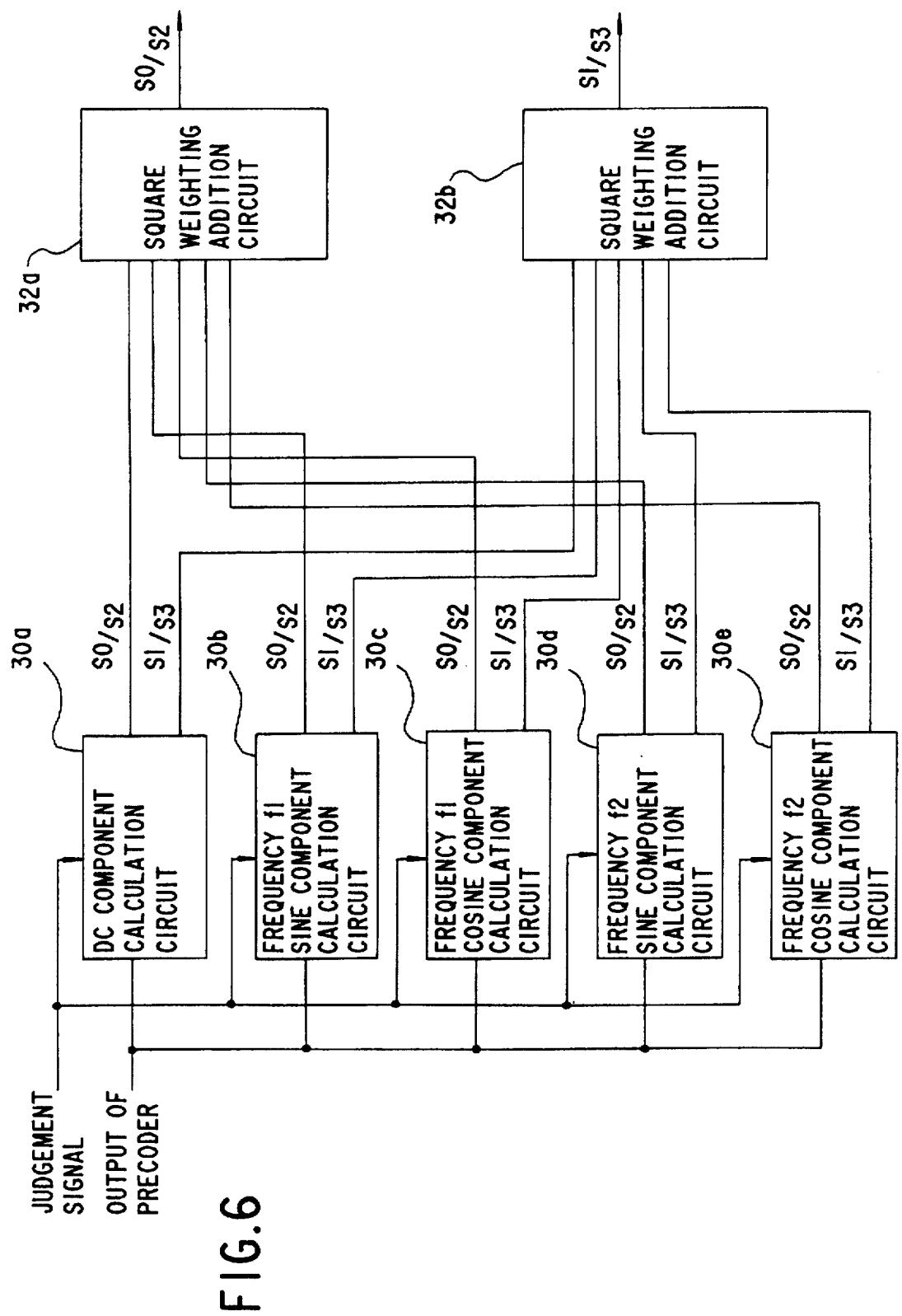
FIG. 6 is a block diagram showing a portion of FIG. 4 embodiment.

Constitution of the frequency component extraction circuit 18 is shown in FIG. 6. The S0 code outputted from the precoder 14 is applied to a DC component calculation circuit 30a which operates as a Fourier transform circuit, a frequency f1 sine component calculation circuit 30b, a frequency f1 cosine component calculation circuit 30c, a frequency f2 sine component calculation circuit 30d and a frequency f2 cosine component calculation circuit 30e. Then, the S1 code to the S3 code are generated on the basis of the S0 code, and thereafter, a sine component and a cosine component of each of the S0 code and the S1 code or each of the S2 code and the S3 code are calculated in accordance with the judgment signal, and the calculation results are outputted. S0 associate calculation results or S2 associate calculation results out of the count results outputted from the calculation circuits 30a to 30e are applied to a square weighting addition circuit 32a, and S1 associate calculation results or S3 associate calculation results therein are applied to a square weighting addition circuit 32b. Then, an addition results is outputted from each of the square weighting addition circuits 32a and 32b, and then applied to the judgment circuit 20. In addition, S* associate calculation results means accumulated values of the frequency components until an S* code (a code inputted by this time).

The judgment circuit 20 shown in FIG. 4 outputs a low level signal in judging that the square weighting addition value of the S0 associate calculation results or the square weighting addition value of the S2 associate calculation results is small, and outputs a high level signal in judging that the square weighting addition value of the S1 associate calculation results or the square weighting addition value of the S3 associate calculation results is small.

Figure 7:
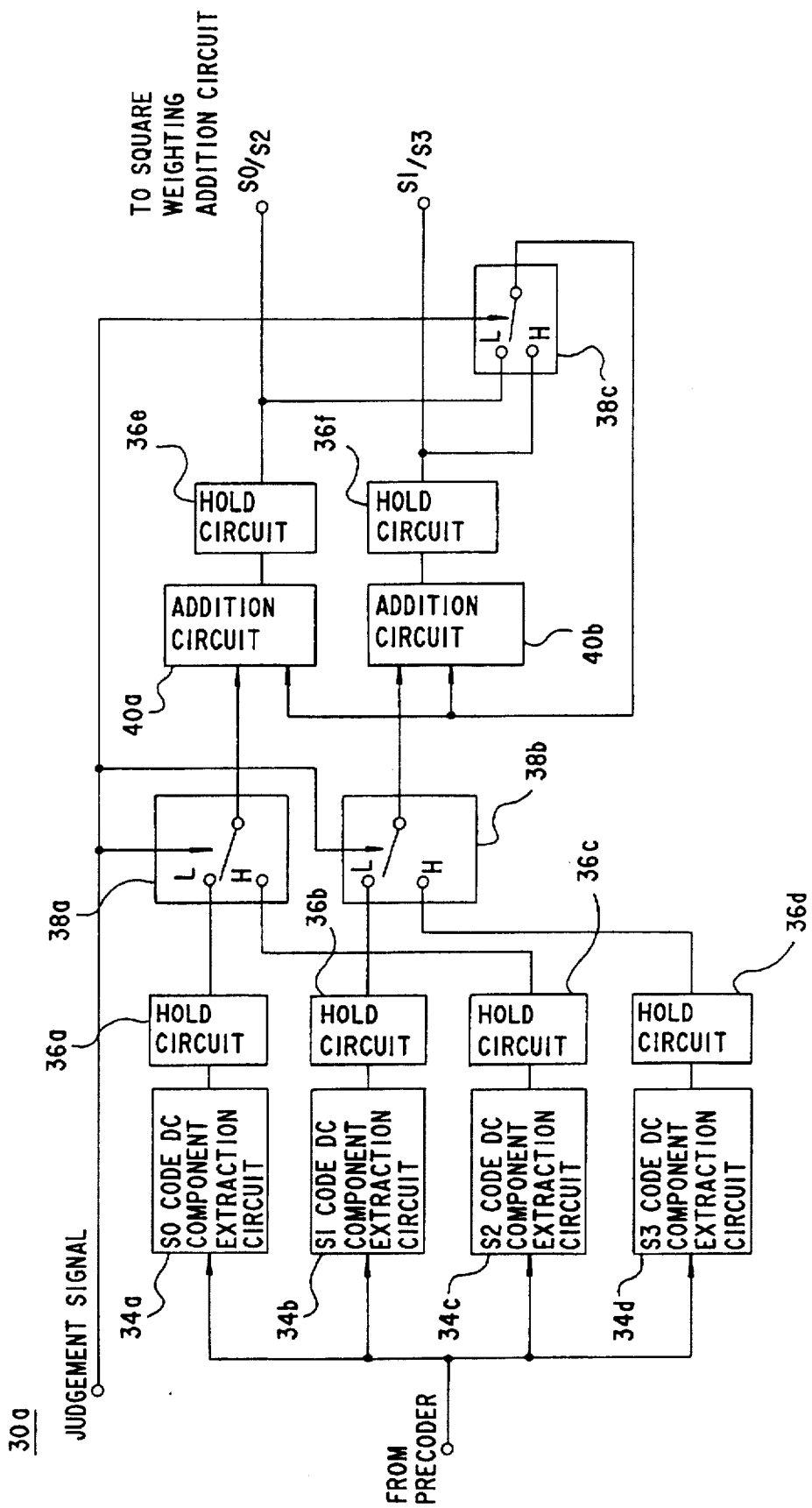
FIG. 7 is a block diagram showing a portion of FIG. 4 embodiment.
Figure 8:
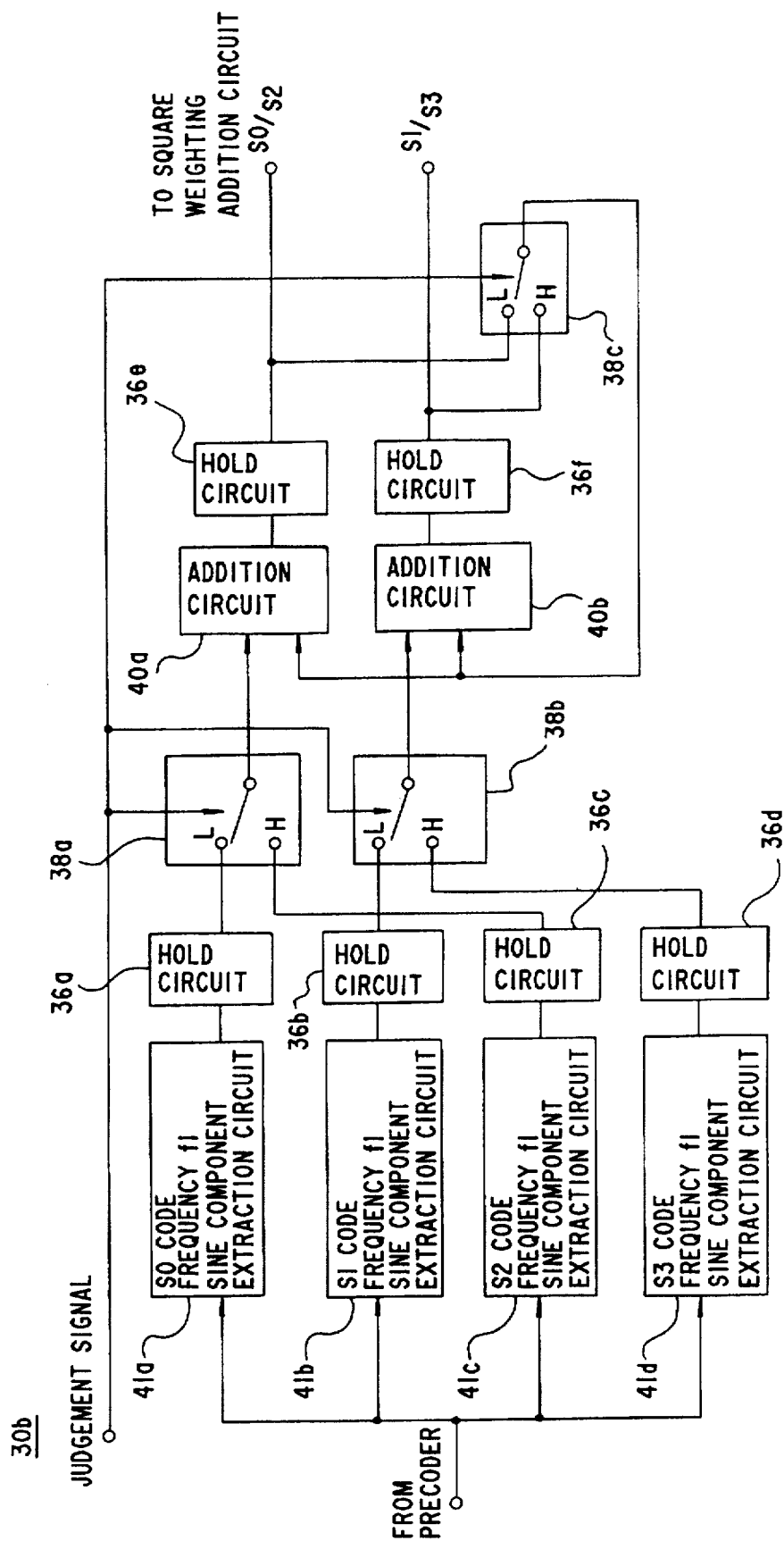
FIG. 8 is a block diagram showing a portion of FIG. 4 embodiment.
Figure 9:
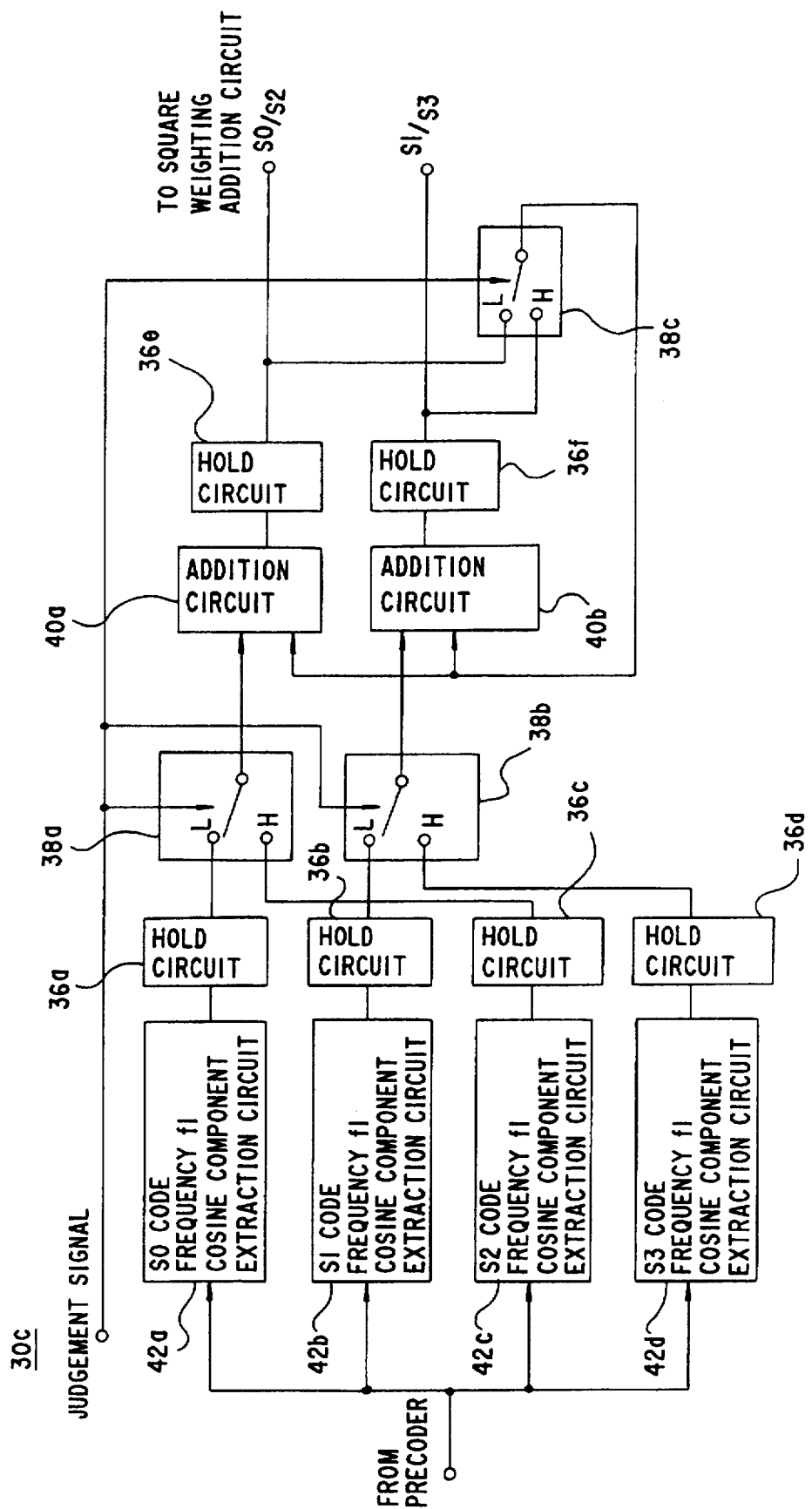
FIG. 9 is a block diagram showing a portion of FIG. 4 embodiment.
Figure 10:
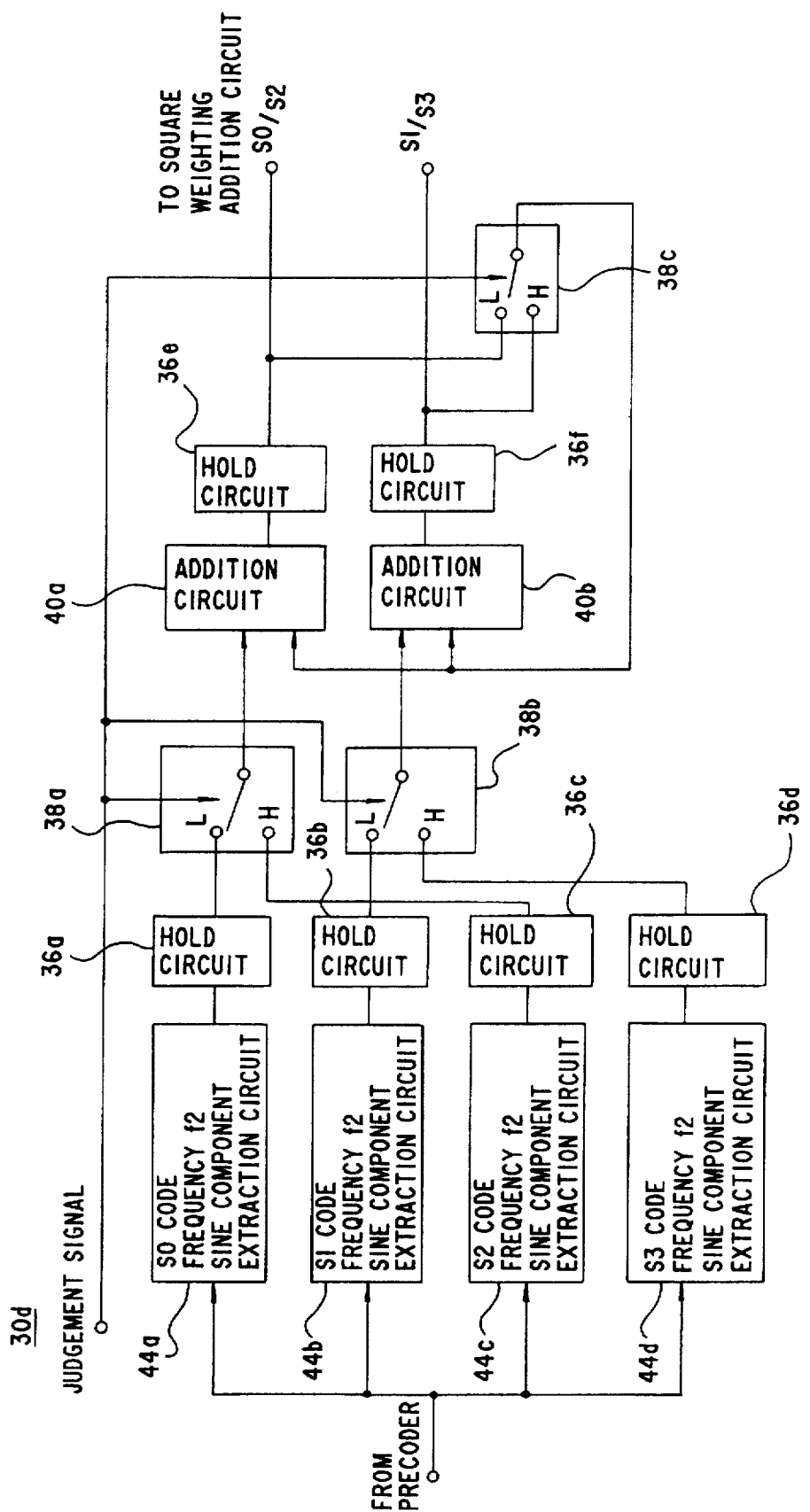
FIG. 10 is a block diagram showing a portion of FIG. 4 embodiment.
Figure 11:
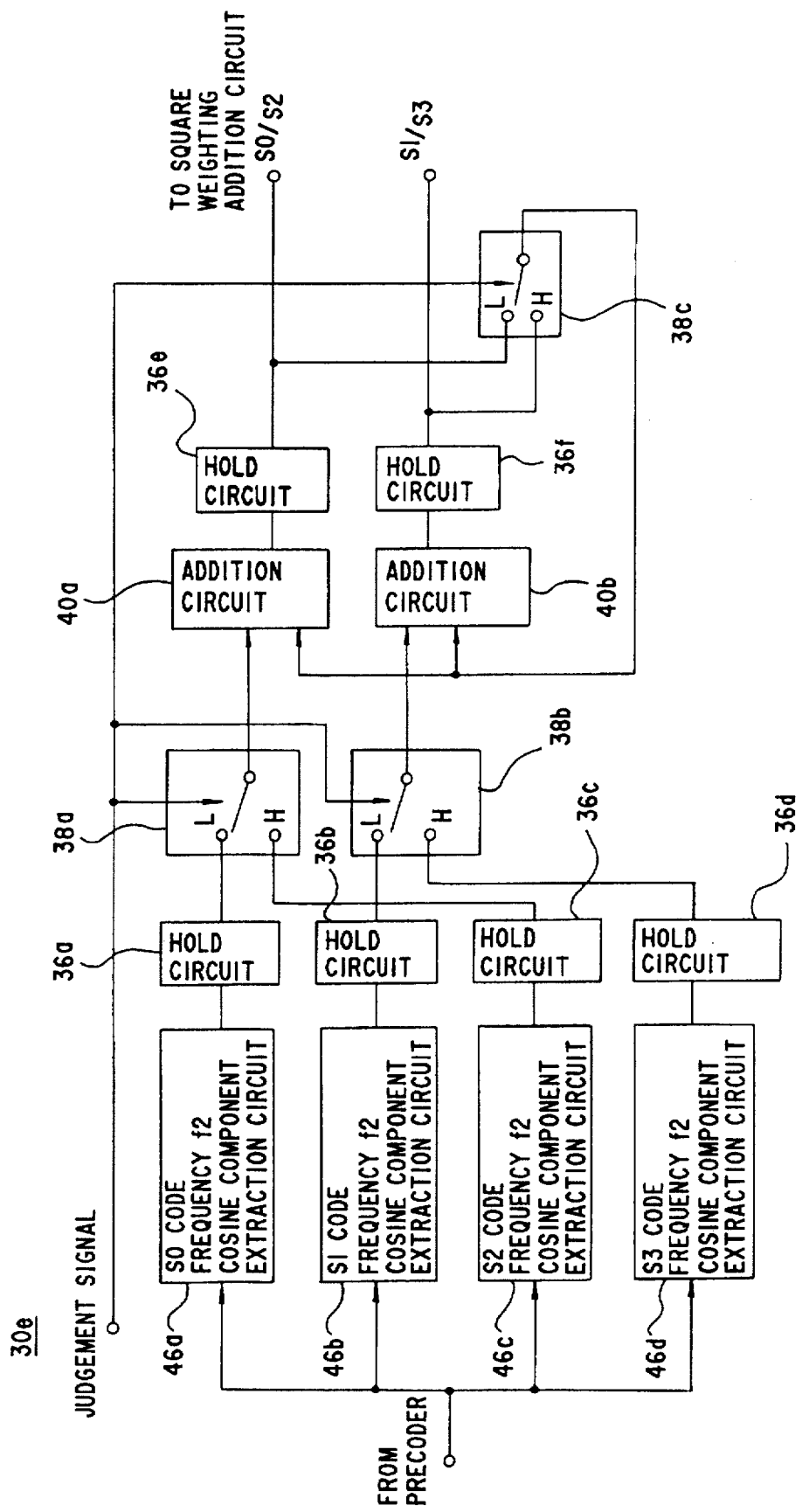
FIG. 11 is a block diagram showing a portion of FIG. 4 embodiment.

With referring to FIG. 7, the DC component calculation circuit 30a includes DC component extraction circuits 34a to 34d for the S0 code to the S3 code. A DC component of the S0 code applied from the precoder 14 is extracted by the DC component extraction circuit 34a, and the S1 code to the S3 code are generated on the basis of the S0 code and then the DC components of the codes S1 to S3 are extracted by the DC component extraction circuits 34b to 34d, respectively. The extracted DC components are held for one code period by hold circuits 36a to 36e, respectively, and thereafter, outputs of the hold circuits 36a and 36c are applied to a switch 38a, and outputs of the hold circuits 36b and 36d are applied to a switch 38b. The switches 38a and 38b are controlled by the judgment signal obtained by judging the square weighting addition value of the preceding or last code such that two kinds of DC components having a chain relationship out of the four kinds of DC components held can be selected. More specifically, the DC components of the S0 code and the S1 code are selected when the judgment signal is the low level, and the DC components of the S2 code and the S3 code are selected when the judgment signal is the high level.

The DC components outputted from the switches 38a and 38b are applied to addition circuits 40a and 40b, respectively, and added to accumulation result which is obtained till the last or preceding code is outputted from a switch 38c. Addition values by addition circuits 40a and 40b are then held by hold circuits 36e and 36f, and outputs of the hold circuits 36e and 36f are applied to the square weighting addition circuits 32a and 32b as the calculation results, and to the switch 38c. In addition, the switch 38c is controlled by the judgment signal which judged the square weighting addition value of outputs of the hold circuits 36e and 36f, and selects the output of the hold circuit 36e when the judgment signal is the low level, and selects the output of the hold circuit 36f when the judgment signal is the high level. Therefore, the S0 associate calculation result and the S1 associate calculation circuit are outputted from the hold circuit 36e and 36f, respectively at a time that the judgment signal is the low level, and the S2 associate calculation result and the S3 associate calculation result are outputted from the hold circuits 36e and 36f, respectively when the judgment signal is the high level.

Figure 12:
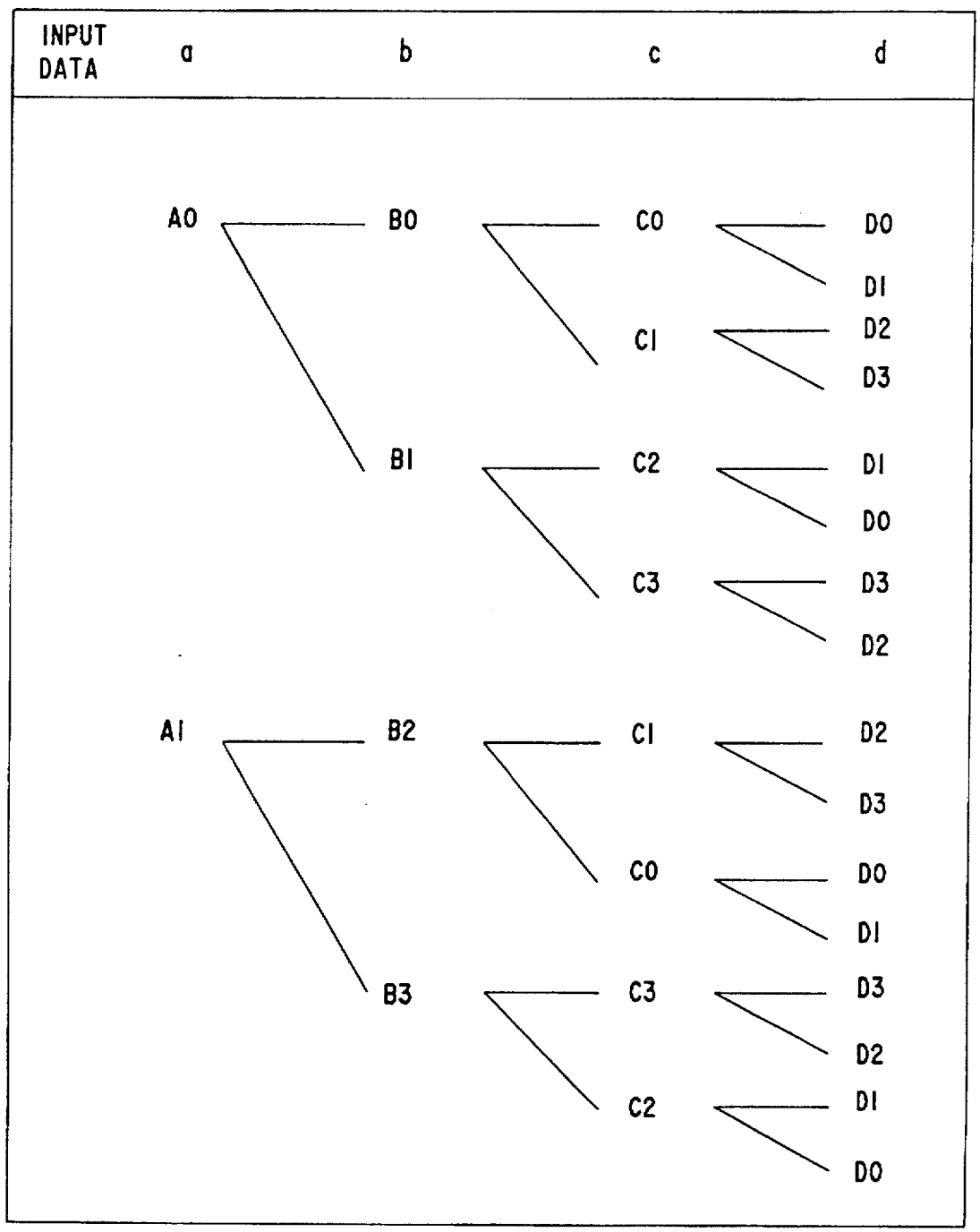
FIG. 12 is an illustrative view showing a portion of an operation of FIG. 4 embodiment.

The switches 38a to 38c are thus changed-over, and therefore, the addition circuits 40a and 40b operate as a first addition means and a second addition means, a third addition means and a fourth addition means, a fifth addition means and a sixth addition means or a seventh addition means and a eighth addition means. Furthermore, the chain relationship of the DC components outputted from the switches 38a and 38b and the calculation results outputted from the hold circuits 36e and 36f are shown in FIG. 12. More specifically, at a time that the DC components of code B0 to B3 are extracted by the DC component extraction circuits 34a to 34d, for example, if the judgment circuit 20 judges that a square weighting addition value of an A0 associate calculation result is the smallest in the square weighting addition values of the A0 associate calculation result and an A1 associate calculation result, the judgment signal of the low level is outputted from the judgment circuit 20. Therefore, the DC components of the B0 code and the B1 code are applied to the addition circuits 40a and 40b from the switches 38a and 38b, and the A0 associate calculation result is applied to the addition circuits 40a and 40b from the switch 38c.

Accordingly, the addition circuits 40a and 40b operate as the first addition means and the second addition means at this time. Therefore, a B0 associate calculation result (an addition value of the DC component of the B0 code and the A0 associate calculation result) and a B1 associate calculation result (an addition value of the DC component of the B1 code and the A0 associate calculation result) are outputted from the hold circuits 36e and 36f at a next time. Furthermore, at a time that the DC component of the C0 code to the C3 code of the succeeding input data c are extracted, if it is judged that the square weighting addition value of the B1 associate calculation result inputted to the judgment circuit 20 is small, the high level signal is outputted from the judgment circuit 20. Therefore, the DC components of the C2 code and C3 code are outputted from the switches 38a and 38b, and the B1 associate calculation result is outputted from the switch 38c. Accordingly, the addition circuits 40a and 40b operate as the third addition means and the fourth addition means at this time. Therefore, a C2 associate calculation result and a C3 associate calculation result are outputted from the hold circuits 36e and 36f at a next time.

Because of such a chain relation, the addition circuits 40a and 40b operate as the first addition means and the second addition means or the third addition means and the fourth addition means after they operated as the first addition means and the second addition means, and operate as the fifth addition means and the sixth addition means or the seventh addition means and the eighth addition means after they operated as the third addition means and the fourth addition means. Furthermore, the addition circuits 40a and 40b operate as the first addition means and the second addition means or the third addition means and the fourth addition means after the operation thereof as the fifth addition means and the sixth addition means, and operate as the fifth addition means and the sixth addition means or the seventh addition means and the eight addition means after the operation thereof as the seventh addition means and the eighth addition means.

In addition, though the frequency f1 sine component calculation circuit 30b, the frequency f1 cosine component calculation circuit 30c, the frequency f2 sine component calculation circuit 30d and the frequency f2 cosine component calculation circuit 30e are shown in FIG. 8 to FIG. 11, constitution of each of the calculation circuits 30b to 30e are the same as the DC component calculation circuit 30a except that the DC component extraction circuits 34a to 34e shown in FIG. 7 are replaced with frequency f1 sine component extraction circuits 41a to 41d, frequency f1 cosine component extraction circuits 42a to 42d, frequency f2 sine component extraction circuits 44a to 44d and frequency f2 cosine component extraction circuits 46a to 46d, accordingly, duplicate description is omitted by adding the same referring numerals for the same point, and therefore by applying the same or similar reference numerals to the same or similar circuits, a duplicate description will be omitted here.

Constitution of the square weighting addition circuit 32a is shown in FIG. 13. The S0 associate calculation results or the S2 associate calculation results outputted from the DC component calculation circuit 30a, the frequency f1 sine component calculation circuit 30b, the frequency f1 cosine component calculation circuit 30c, the frequency f2 sine component calculation circuit 30d and the frequency f2 cosine component calculation circuit 30e are squared by square circuits 48a to 48e, respectively. Then, though an output from the square circuit 48a is just weighted with predetermined value by a multiplication circuit 50a, outputs of the square circuits 48b and 48c are added to each other by an addition circuit 52a, and then, weighted by a multiplication circuit 50b, and outputs of square circuits 48d and 48e are also added to each other by an addition circuit 52b, and then, weighted by a multiplication circuit 50c. Thereafter, outputs of the multiplication circuits 50a to 50c are added to each other by an addition circuit 52c and then outputted to the judgment circuit 20. In addition, since a square weighting addition circuit 30b is constituted in the same manner as the square weighting addition circuit 32a, a duplicate description is omitted. However, the S1 associate calculation results or the S3 associate calculation results outputted from the DC component calculation circuit 30a, the frequency f1 sine component calculation circuit 30b, the frequency f1 cosine component calculation circuit 30c, the frequency f2 sine component calculation circuit 30d and the frequency f2 cosine component calculation circuit 30e are inputted to the square weighting addition circuit 32b.

Constitution of the 4-code generation circuit 22 of FIG. 4 is shown in FIG. 14. The S0 code via the delay circuit 16 is inputted to a switch 54 as it is, and applied to conversion circuits 56a to 56c to be converted to the S1 code, the S2 code and the S3 code therein. The converted S1 code to the converted S3 code are then applied to the switch 54. Switch 54 is controlled by a selection switching circuit 58 which outputs a control signal on the basis of the inverted code signal, the last judgment signal and the present judgment signal, and selects and outputs one of the code to the S3 code in accordance with a table 1.

TABLE 1

| inverted code signal | judgment signal | | output |
|---|---|---|---|
| | present time | last time | |
| L | L | L | S0 |
| | H | L | S1 |
| | L | H | S2 |
| | H | H | S3 |
| H | L | — | S0 |
| | H | — | S3 |

More specifically, in a case where the inverted code signal is a low level, the S0 code is outputted when both of the last judgment signal and the present judgment signal are the low levels, and the S1 code is outputted when the last judgment signal and the present judgment signal are the low level and the high level, respectively, and the S2 code is outputted when the present judgment signal and the present judgment signal are the high level and the low level, respectively, and the S3 code is outputted when both of the last judgment signal and the present judgment signal are the high level. Furthermore, in a case where the inverted code signal is a high level, the S0 code is outputted when the present inverted signal is the low level, and the S3 code is outputted when the present inverted signal is the high level.

An operation timing at a time that data is inputted is shown in FIG. 15. When outputting of the reference code A0 of the input data "a" from the precoder 14 to the frequency component extraction circuit 18 is finished, outputting of the reference code B0 of the input data "b" is started at a next time. Since the judgment signal is the low level in the beginning, the switches 38a and 38b are connected to the hold circuits 36a and 36b and the components of the A0 code and the A1 code are outputted from the switches 38a and 38b. The judgment result for the A associate codes is determined in 15 clocks later, and the switches 38a to 38c are switched in response to the result. If the high level signal is outputted because a value of the A1 associate calculation results is smaller as a result of the judgement of the square weighting addition values of the A associate calculation results, the components of the B2 code and the B3 code are added to each other out of the A1 associate calculation results and four kinds of component extraction results, and the square weighting addition values of the B2 associate calculation results and the B3 associate calculation results are applied to the judgment circuit 20. Furthermore, the reference code A0 inputted to the 4-code generation circuit 22 with being delayed by the delay circuit 16 for 40 clocks is converted into the A1 code by the last judgment signal of the low level and the present judgment signal of the high level, and then outputted.

If the judgment circuit 20 judges that the square weighting addition value of the B2 associate calculation results is small at 15th clock from a timing that the precoder 14 begins to output the reference code C0 of the input data "c", and then outputs the low level signal, the B2 associate calculation results and the components of the C0 code and the C1 code are added to each other, and the square weighting addition values of the C0 associate calculation results and the C1 associate calculation results are applied to the judgment circuit 20. Furthermore, the reference code B0 inputted to the 4-code generation circuit 22 is converted into the B2 code by the last judgment signal of the high level and the present judgment signal of the low level.

If the judgment circuit 20 outputs the low level signal because the judgment circuit 20 judges that the square weighting addition value of the C0 associate calculation results is smaller at 15th clock from a timing that the precoder 14 begins to output the reference code D0 of the input data "d", the C0 associate calculation results and the components of the D0 code and the D1 code are added to each other, and the square weighting addition values of the D0 associate calculation results and the D1 associate calculation results are applied to the judgment circuit 20. Furthermore, since both of the last judgment signal and the present judgment signal are the low levels, the 4-code generation circuit 22 outputs the reference code C0 as it is.

A processing operation of the particular data that two kinds of particular codes are determined irrespective of the last code and used for the synchronization signal area, the overwrite margin area and etc. will be described. All bits have the inverted relationship about the two kinds of the particular codes RUN-A and RUN-B formats of which are determined by a specification for the particular data, as shown in FIG. 16. More specifically, if the particular code RUN-A is assumed as the reference code S0, the particular code RUN-B is the S3 code. When the particular data is applied to the precoder 14, the inverted code signal of the high level is applied to the switches 24a and 24b simultaneously, whereby the outputs of the latch circuits 26a and 26b are applied to the input terminals of the EXOR circuit 28a and 28b, respectively. Therefore, a code outputted from the precoder 14 becomes the reference code S0 (the particular code RUN-A) even if the outputs from the latch circuits 26a and 26b are any of "00", "01", "10" and "11", as shown in FIG. 17(A) to FIG. 17(D).

In the frequency component extraction circuit 18, it is possible to process the particular data in the same manner as that of the S0 code to the S3 code of the normal data by generating and processing the S0 code by the respective component extraction circuits 34a, 40a, 42a, 44a and 46a for the S0 code and by generating the S3 code by the respective component extraction circuits 34b, 40b, 42b, 44b and 46b for the S1 code and generating the S0 code by the respective component extraction circuits 34c, 40c, 42c, 44c and 46c for the S2 code, and by generating the S3 code by the respective component extraction circuits 34d, 40d, 42d, 44d and 46d for the S3 code. Furthermore, the switch 54 of the 4-code generation circuit 22 is switched in response to only the present judgment signal. More specifically, as shown in the table 1, the S0 code is outputted from the switch 54 when the present judgment signal is the low level, and the S3 code is outputted from the switch 54 when the judgment signal is the high level.

Figure 18:
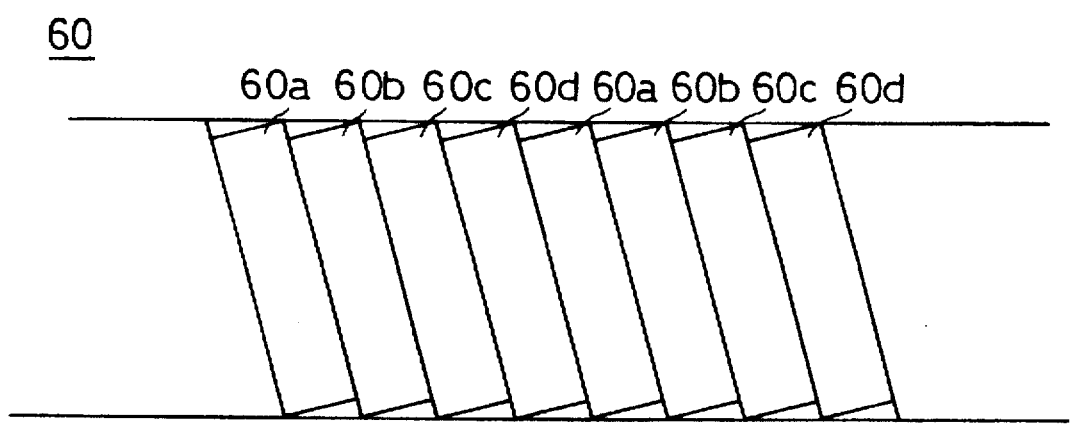
FIG. 18 is an illustrative view showing a portion of FIG. 4 embodiment.
Figure 19A:
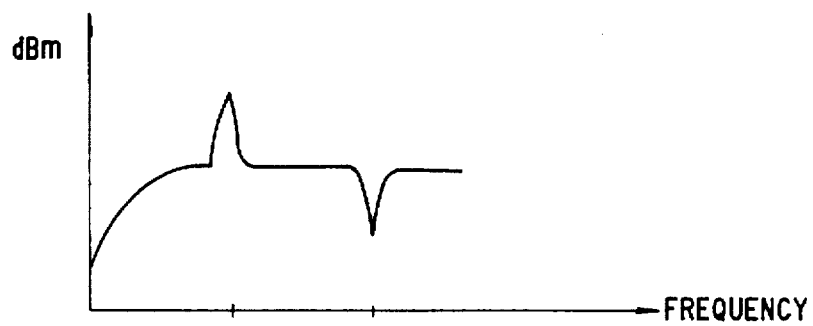
FIG. 19 is a waveform chart showing a frequency spectrum of a record signal.
Figure 19B:
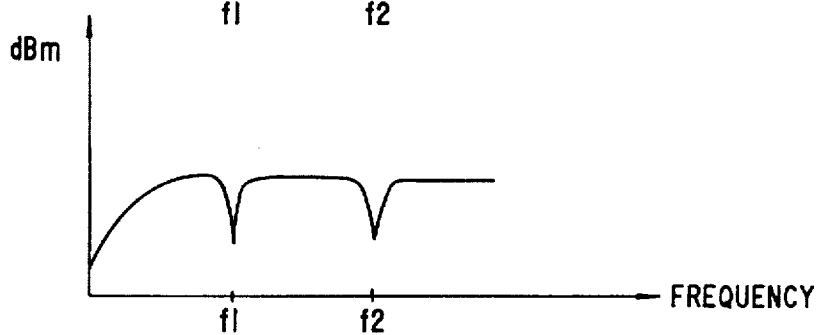
Figure 19C:
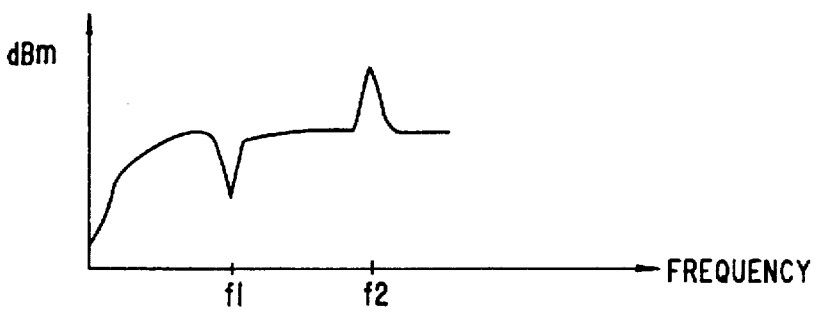

By outputting one of the S0 code to the S3 code from the 4-code generation circuit 22 in accordance with the judgment signal outputted from the judgment circuit 20 and recording on the magnetic tape 60, codes which generates a frequency spectrum as shown in FIG. 19(A) are resultingly recorded into a track 60a of the magnetic tape 60 shown in FIG. 18, codes which generates frequency spectrum shown in FIG. 19(B) are resultingly recorded into tracks 60b and 60d, and codes which generates a frequency spectrum shown in FIG. 19(C) are resultingly recorded into a track 60c.

According to this embodiment, as is different from the prior art that the last two bits of the output code on the basis of the last input data is fed-back, the last two bits of the last or preceding code obtained by the I-NRZ modulation by the precoder 14 are fed-back, and therefore, there is no time restriction in performing the extraction operation of the frequency component and the judgment operation. Accordingly, it is possible to easily encode the input data.

In the embodiment shown in FIG. 4, in a case where the judgment circuit 20 judges that the square weighting addition value of the B1 associate calculation results is the smallest in the square weighting addition values of the B0 associate calculation results and the B1 associate calculation results shown in FIG. 12, for example, the square weighting addition values of the C2 associate calculation results and the C3 associate calculation results are inputted into the judgment circuit 20 at a next time. However, in a case where the square weighting additions values of the B0 associate calculation results and the B1 associate calculation results are approximately the same value, and the square weighting addition values of the C1 associate calculation results is the smallest in the square weighting addition values of the C0 associate calculation results to the C3 associate calculation results, there is a possibility that a code outputted from the 4-code generation circuit 22 is not always an optimum code. A coding apparatus 10 of another embodiment shown in FIG. 20 is to improve such a problem.

Figure 20:
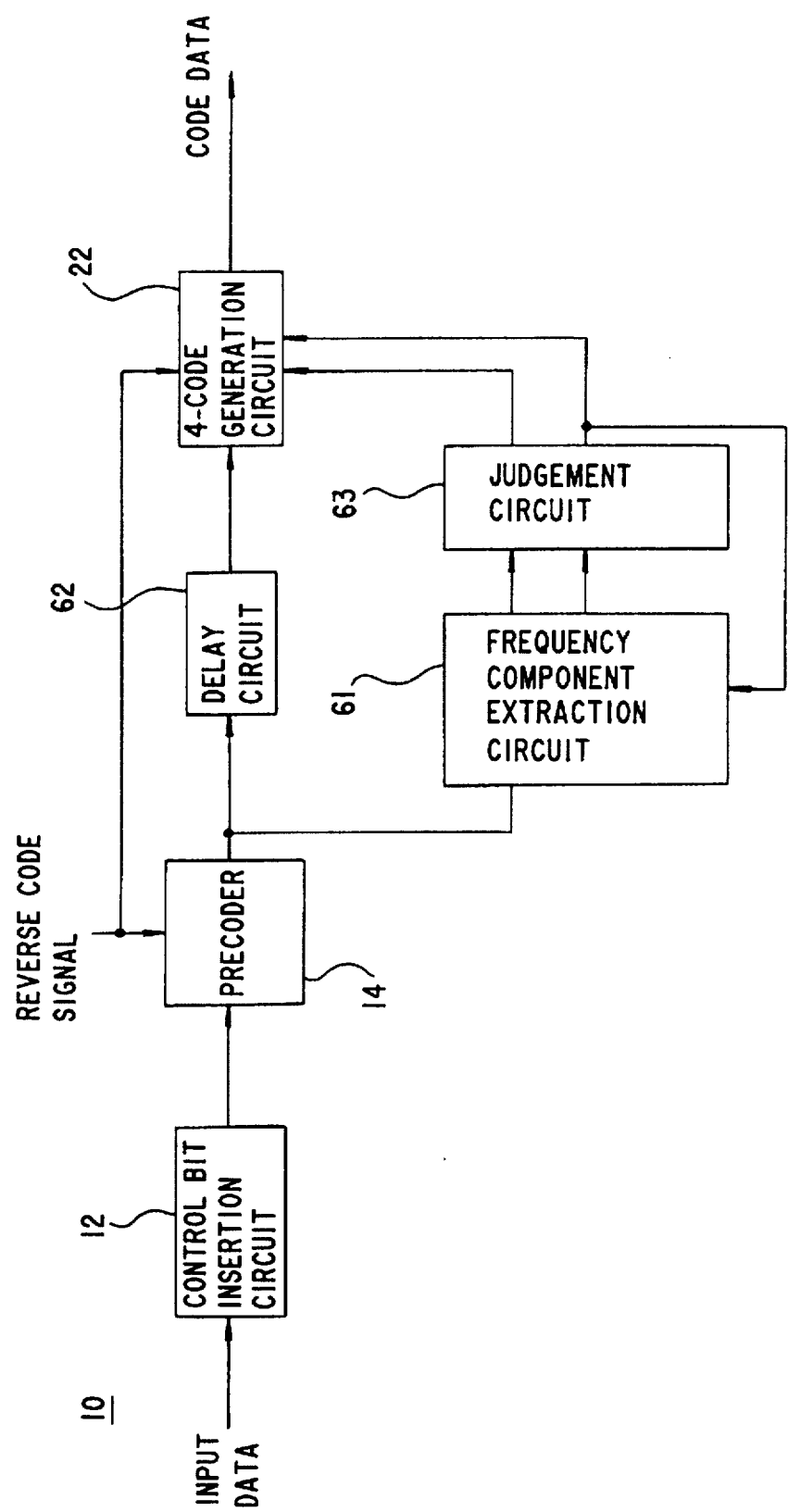
FIG. 20 is a block diagram showing another embodiment according to the present invention.
Figure 21:
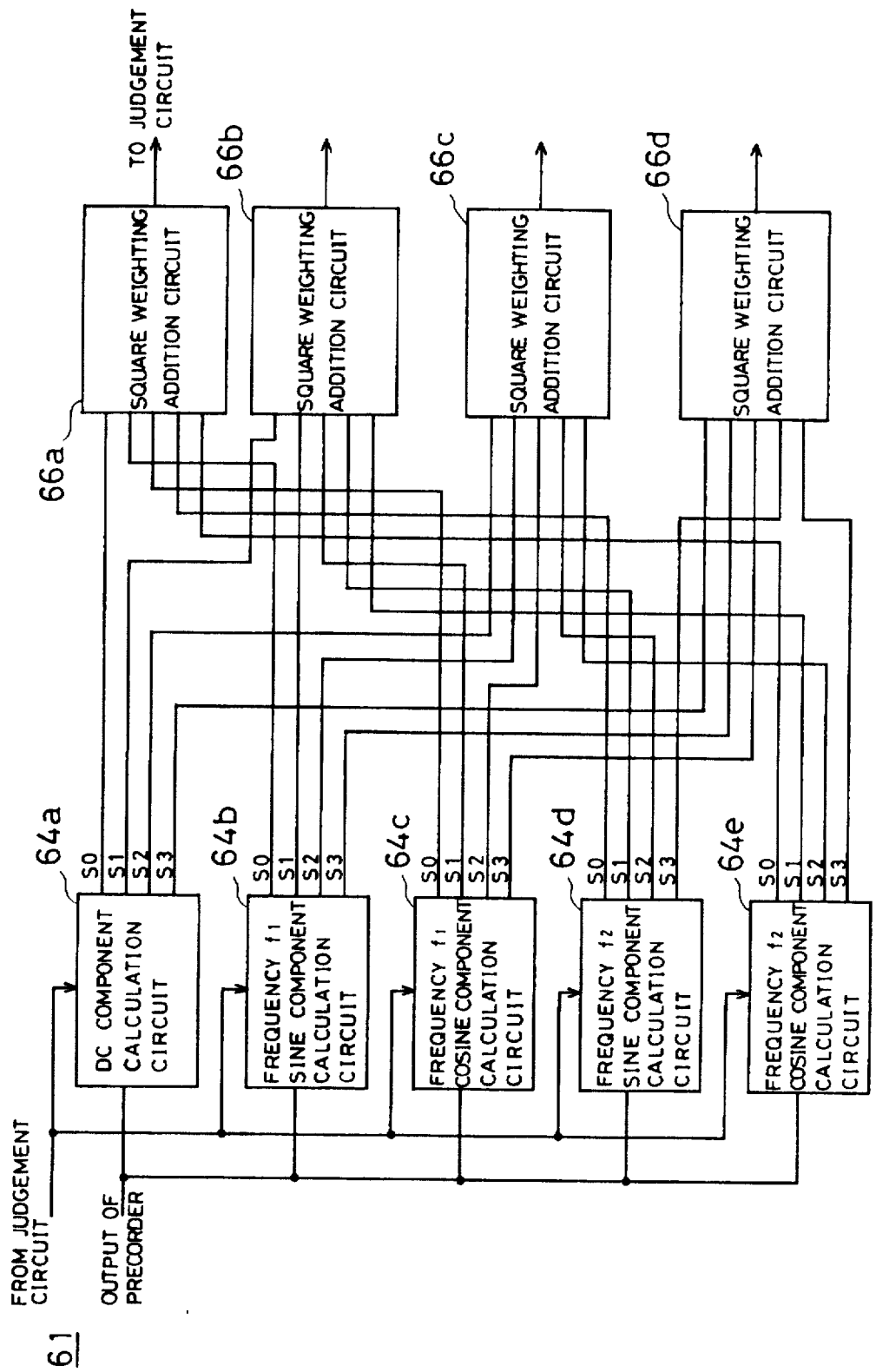
FIG. 21 is a block diagram showing a portion of FIG. 20 embodiment.

With referring to FIG. 20, since the coding apparatus 10 this embodiment shown is the same as the coding apparatus 10 of the embodiment shown in FIG. 4 except that a frequency component extraction circuit 61 is constituted as shown in FIG. 21, and a delay circuit 62 is a 65 clocks delay circuit, and a judgment circuit 63 judges on the basis of four (4) inputs, a duplicate description will be omitted by applying the same reference numerals to the same or similar points.

The frequency component extraction circuit 61 is constituted as shown in FIG. 21. That is, the S0 code outputted from the precoder 14 is applied to a DC component calculation circuit 64a, a frequency f1 sine component calculation circuit 64b, a frequency f1 cosine component calculation circuit 64c, a frequency f2 sine component calculation circuit 64d and a frequency f2 cosine component calculation circuit 64e. Then, predetermined calculation operations are performed according to the judgment signal from the judgment circuit 20, and the S0 associate calculation results to the S3 associate calculation results are outputted therefrom. In these results, the S0 associate calculation results are applied to a square weighting addition circuit 66a, and the S1 associate calculation results are applied to a square weighting addition circuit 66b, and the S2 associate calculation results are applied to a square weighting addition circuit 66c, and the S3 associate calculation results are applied to a square weighting addition circuit 66d. Thereafter, operation results by the square weighting addition circuits 66a to 66d are applied to the judgment circuit 20. In addition, since the square weighting addition circuits 66a to 66d have the same constitution as that of the square weighting addition circuit 32a shown in FIG. 13, a duplicate description will be omitted.

Figure 22:
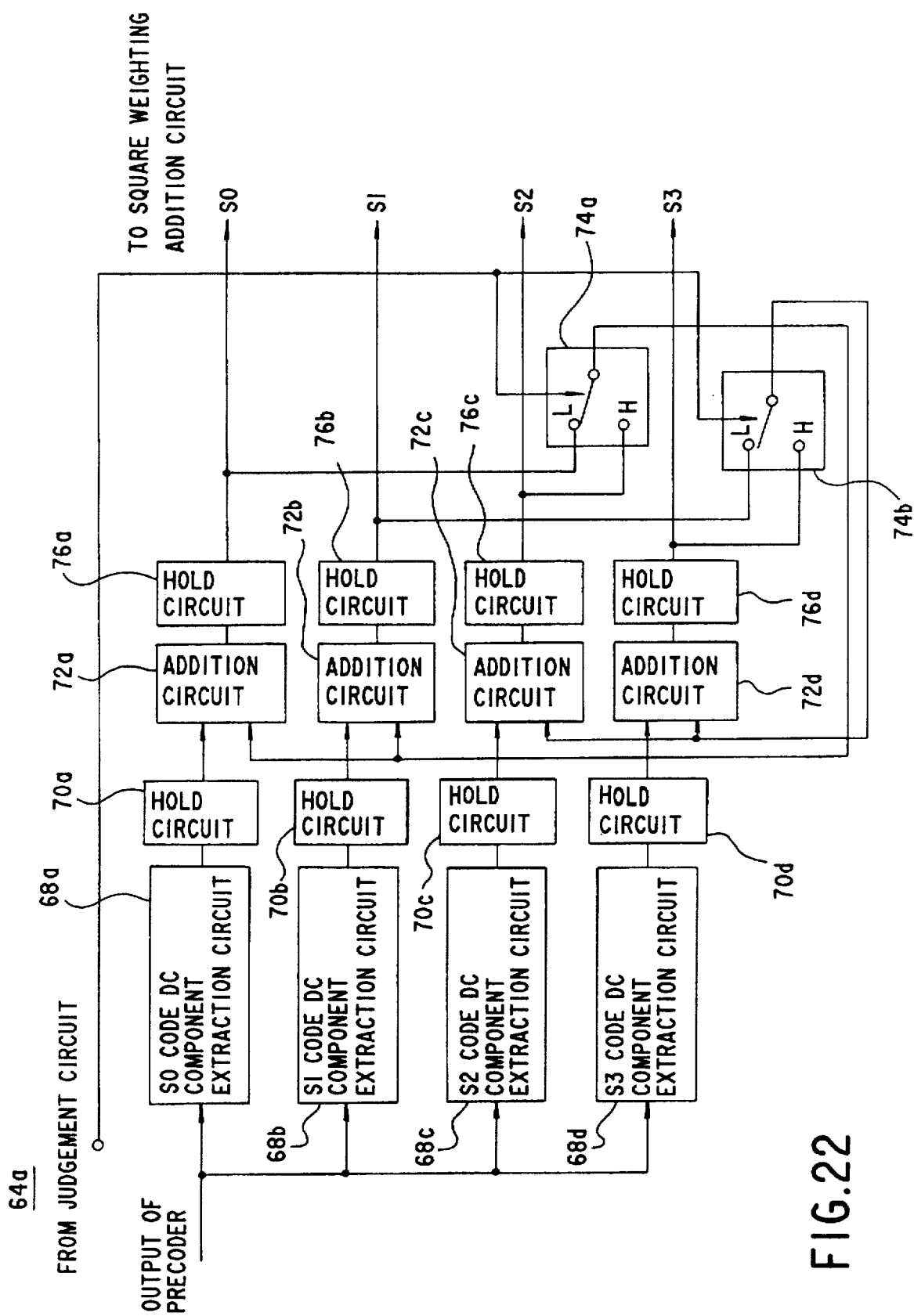
FIG. 22 is a block diagram showing a portion of FIG. 20 embodiment.
Figure 23:
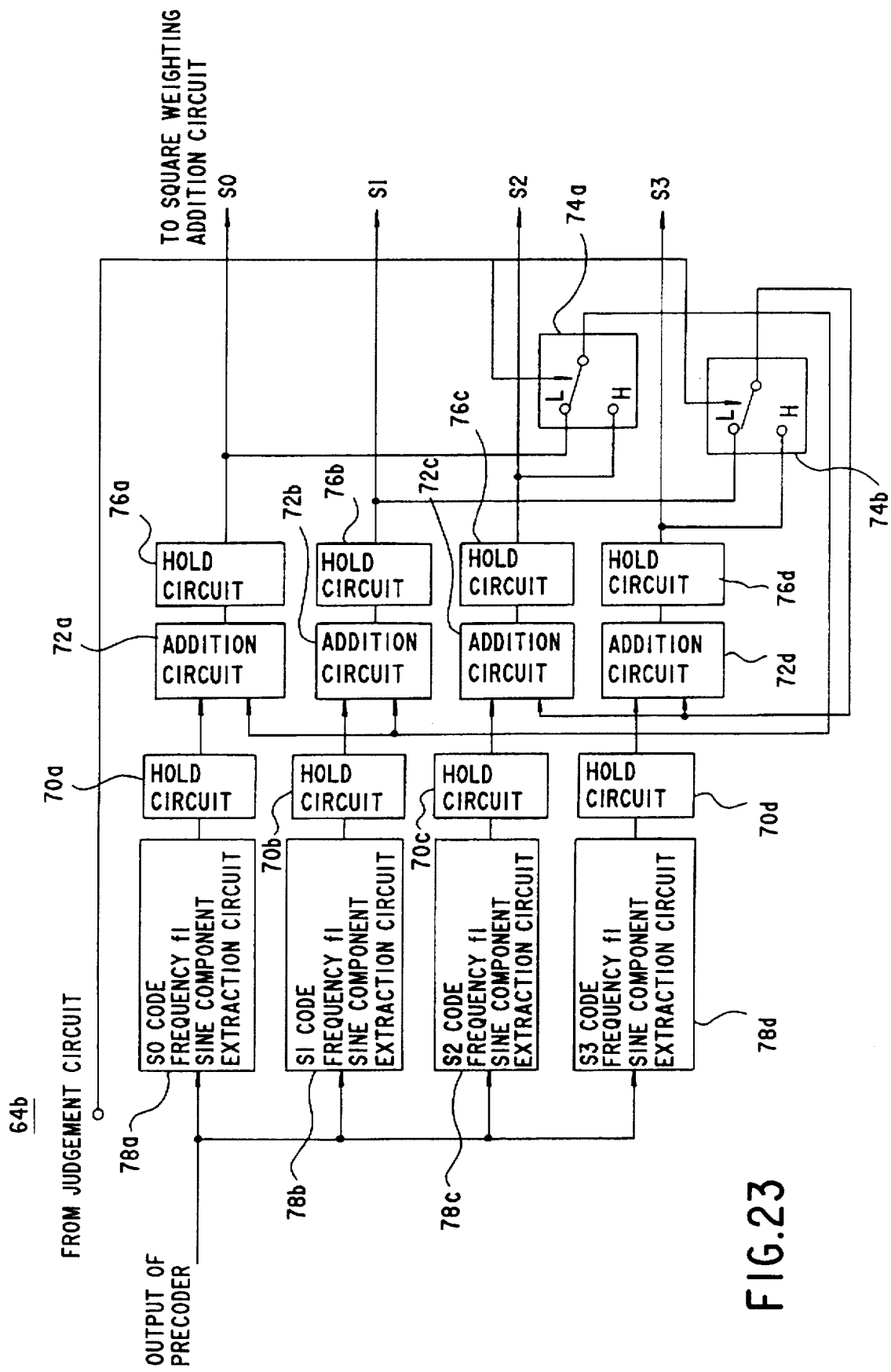
FIG. 23 is a block diagram showing a portion of FIG. 20 embodiment.
Figure 24:
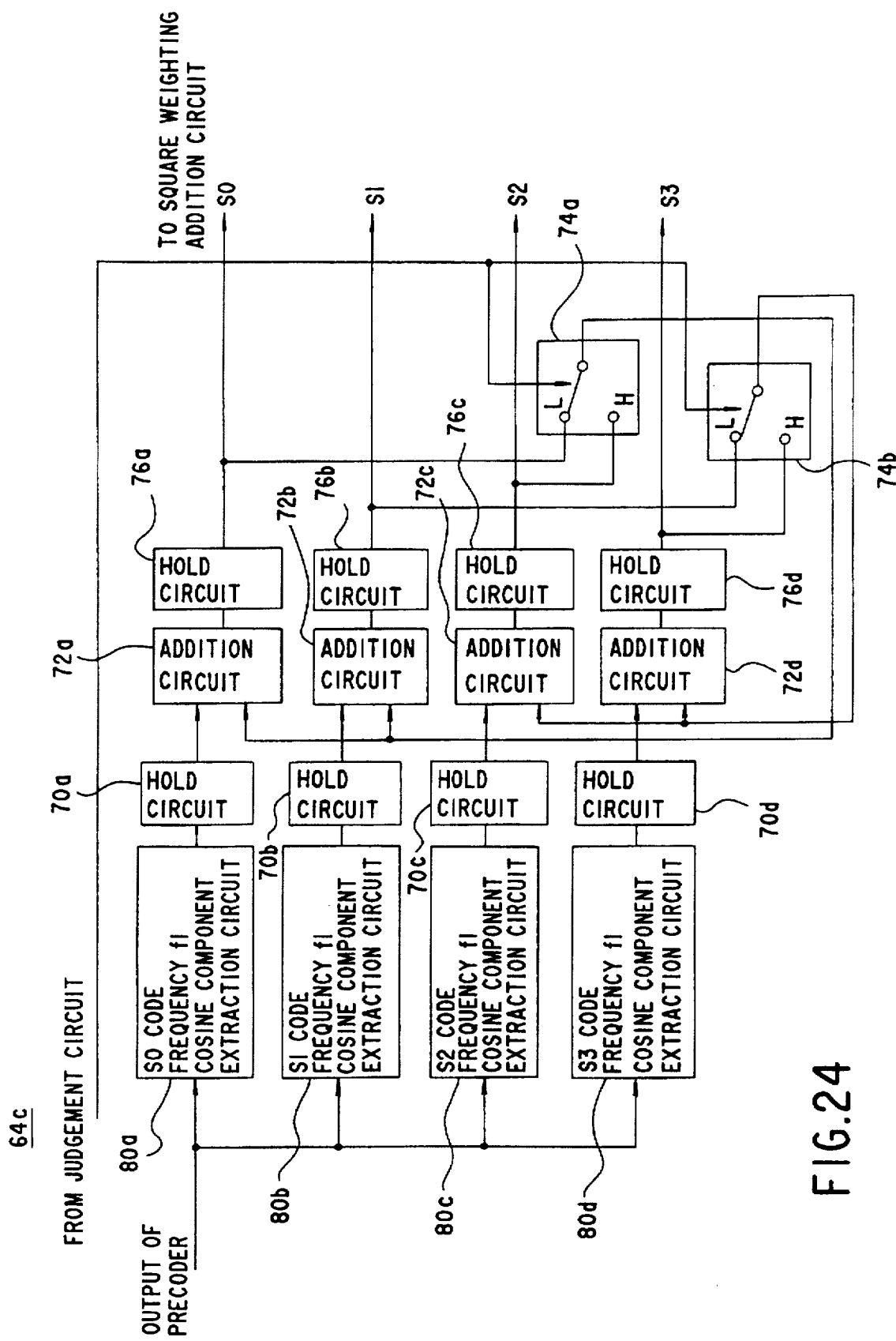
FIG. 24 is a block diagram showing a portion of FIG. 20 embodiment.
Figure 25:
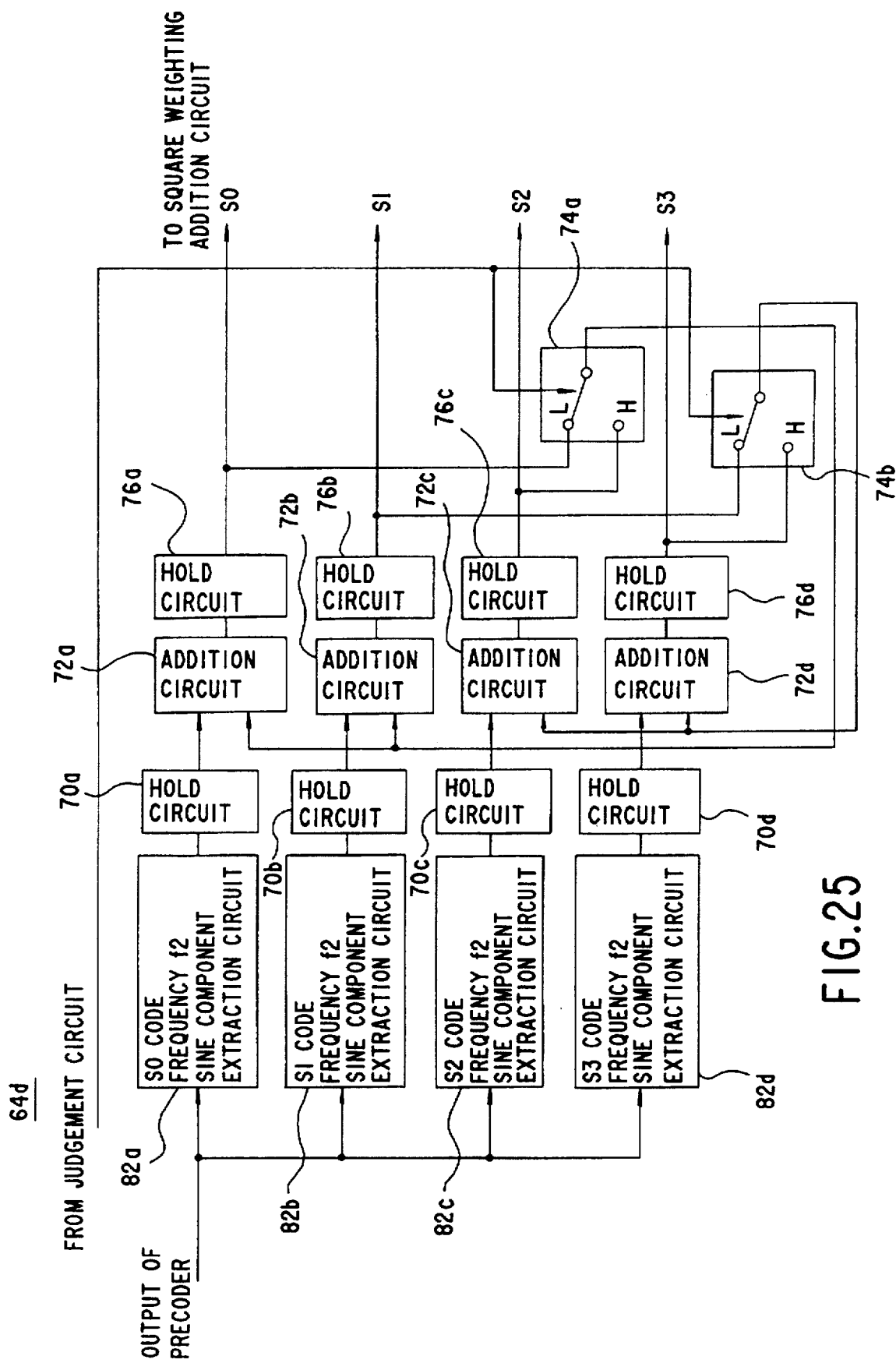
FIG. 25 is a block diagram showing a portion of FIG. 20 embodiment.
Figure 26:
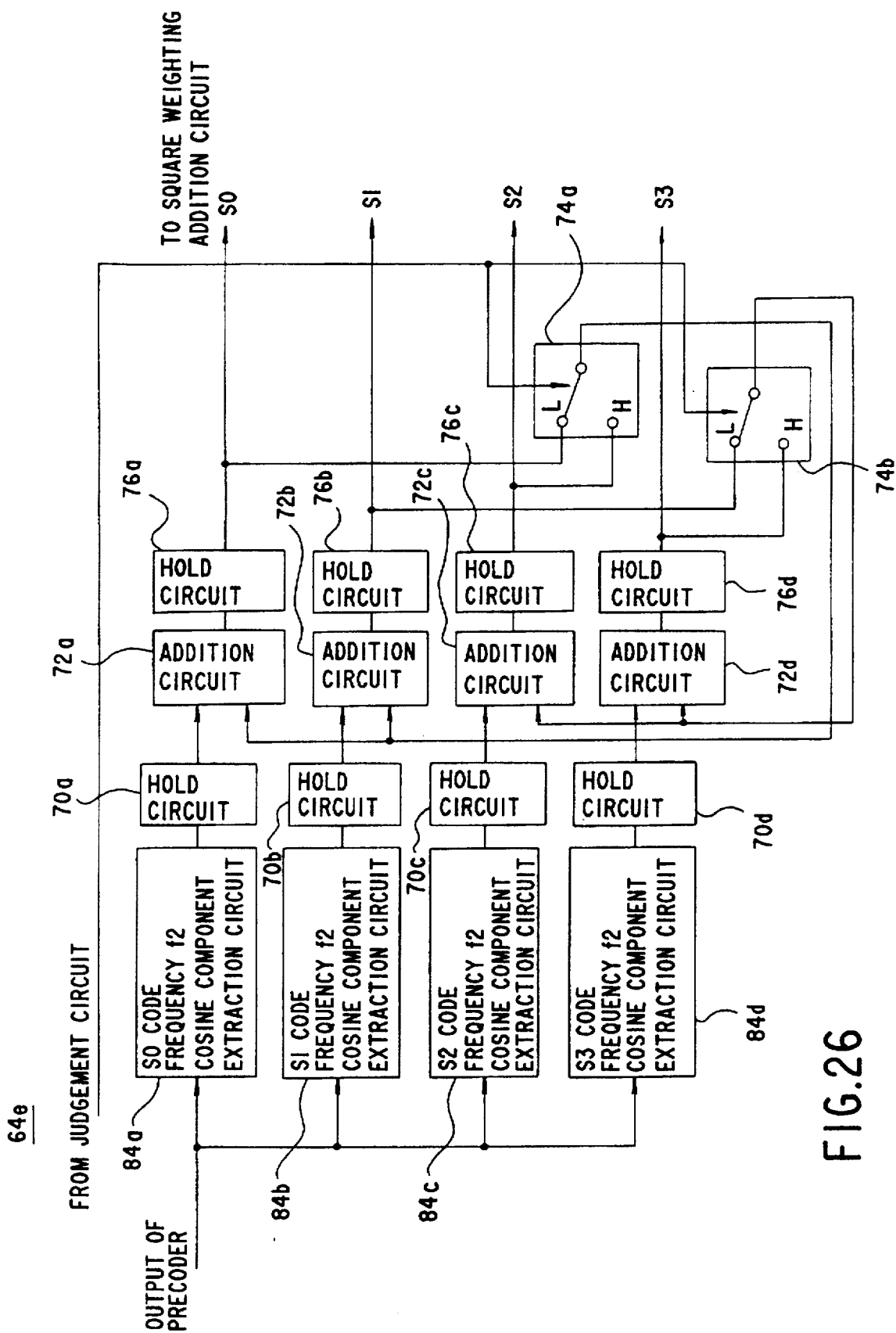
FIG. 26 is a block diagram showing a portion of FIG. 20 embodiment.

With referring to FIG. 22, the S0 code outputted from the precoder 14 is applied to DC component extraction circuits 68a to 68d. Then, though the DC component of the S0 code is extracted by the DC component extraction circuit 68a, in the DC component extraction circuit 68b, the S1 code is generated on the basis of the S0 code as inputted, and then the DC component of the S1 code is extracted. As is the same as the DC component extraction circuit 68b, in the DC component extraction circuits 68c and 68d, the S2 code and the S3 code are generated on the basis of the S0 code, and then the DC components of the S2 code and the S3 code are extracted. The DC components extracted by the DC component extraction circuits 68a to 68d are applied to hold circuits 70a to 70d, and the DC components equal to one code are held therein. Then, the DC components outputted from the hold circuits 70a to 70d are added to calculation results outputted from switches 74a and 74b in addition circuits 72a to 72d.

More specifically, the DC component of the S0 code and the calculation result from the switch 74a are added to each other in the addition circuit 72a, and the DC component of the S1 code and the calculation result from the switch 74a are added to each other in the addition circuit 72b, and the DC component of the S2 code and the calculation result from the switch 74b are added to each other in the addition circuit 72c, and the DC component of the S3 code and the calculation result from the switch 74b are added to each other in the addition circuit 72d. The addition values outputted from the addition circuits 72a to 72d are held by hold circuits 76a to 76d, respectively, and then outputted to square weighting addition circuits 66a to 66d as the calculation result at a next time, respectively. Furthermore, outputs of the hold circuits 76a and 76c are applied to the switch 74a, and outputs of the hold circuits 76b and 76d are applied to the switch 74b. The switches 74a and 74b are switched in accordance with the judgment signal from the judgment circuit 22, and the outputs of the hold circuits 76a and 76b are outputted from the switches 74a and 74b when the judgment signal is the low level, and the outputs of the hold circuits 76c and 76d are outputted when the judgment signal is the high level.

By changing-one the switching of the switches 74a and 74b in such a manner, the addition circuits 72a to 72d operate as the first addition means to the fourth addition means or the fifth addition means to the eighth addition means. Furthermore, the chain relationship of the calculation results outputted from the hold circuits 76a to 76d is shown in FIG. 12. That is, if the judgment signal is the high level, because the B0 associate calculation results to the B3 associate calculation results are outputted from the hold circuits 76a to 76d and the square weighting addition value thereof are judged by the judgment circuit 20, for example, the switches 74a and 74b are switched for the hold circuits 76c and 76d, respectively. Therefore, the B2 associate calculation results and the B3 associate calculation results outputted from the switches 74a and 74b are properly added to the DC components of the C0 code to the C3 code outputted from the hold circuits 70a to 70d. Accordingly, the addition circuits 72a to 72d operate as the fifth addition means to the eighth addition means at this time. Then, the C0 associate calculation results to the C3 associate calculation results are outputted from the hold circuits 76a to 76d at the next time, respectively. Thereafter, if the judgment signal is the low level because the C0 associate calculation results to the C3 associate calculation results are judged in the same manner, the C0 associate calculation results and the C1 associate calculation results outputted from the switches 74a to 74b are properly added to the DC components of the D0 code to the D3 code. Accordingly, the addition circuits 72a to 72b operate as the first addition means to the fourth addition means at this time. In addition, the judgment circuit 20 outputs the low level signal when the square weighting addition value of the S0 associate calculation results or the S1 associate calculation results is judged to be the smallest, and outputs the high level signal when the square weighting addition value of the S2 associate calculation results or the S3 associate calculation results is judged to be the smallest.

Because of such the chain relationship, the addition circuits 72a to 72d operate as the first addition means to the fourth addition means or the fifth addition means to the eighth addition means after the same operate as the first addition means to the fourth addition means, and operate as the first addition means to the fourth addition means or the fifth addition means to the eight addition means after the operation as the fifth addition means to the eight addition means.

With referring to FIG. 23 to FIG. 26, since the frequency f1 sine component calculation circuit 64b, the frequency f1 cosine component calculation circuit 64c, the frequency f2 sine component calculation circuit 64d and the frequency f2 cosine component calculation circuit 64e are the same as the DC component calculation circuit 64a except that frequency f1 sine component extraction circuits 78a to 78d, frequency f1 cosine component extraction circuits 80a to 80d, frequency f2 sine component extraction circuits 82a to 82d and frequency f2 cosine component extraction circuits 84a to 84d are provided instead of the DC component extraction circuits 68a to 68d shown in FIG. 22, a duplicated description will be omitted by applying the same reference numerals to the same or similar components.

An operation timing is shown in FIG. 27. When the outputting of the reference code A0 of the input data "a" from the precoder 14 to the frequency component extraction circuit 61 is finished, at a next time, the outputting of the reference code B0 of the input data "b" from the precoder 14 is started. Respective components of the A0 code to the A3 code are outputted from the hold circuits 70a to 70d at the same timing as the start of the output, and then, the judgment result of the square weighting addition value of the A associate calculation results is evaluated at 15th clock. The judgment result has no sense in a case of the chain of two codes, and the judgment signal maintains the low level thereof. Therefore, the A0 associate calculation results and the A1 associate calculation results are selected by the switches 74a and 74b, and then, the A0 associate calculation results and the components of the B0 code and the B1 code are added to each other by the addition circuits 72a and 72b, and the A1 associate calculation results and the components of the B2 code and the B3 code are added to each other by the addition circuits 72c and 72d.

The judgment result of the square weighting addition value of the B associate calculation results is evaluated at 15th clock from the timing that the components of the B0 code to the B3 code are outputted from the hold circuits 70a to 70d, i.e. 15th clock from the timing that the precoder 14 begins to output the reference code C0. If the judgment signal of the high level is outputted at this time because the square weighting addition value of the B2 associate calculation results or the B3 associate calculation results is the smallest, the B2 associate calculation results and the B3 associate calculation results are selected by the switches 74a and 74b, respectively, and then properly added to the components of the C0 code to the C3 code outputted from the bold circuits 70a to 70d. Furthermore, the A1 code is selected by the 4-code generation circuit 22 in accordance with the present judgment signal of the high level and the last judgment signal of the low level, and then outputted, as understood from the table 1.

The judgment result of the square weighting addition value of the C associate calculation results is evaluated at 15th clock from the timing that the components of the C0 code to the C3 code are outputted from the hold circuits 70a to 70d, that is, 15th clock from the timing that the precoder 14 begins to output the reference code D0. When the judgment signal of the low level is outputted because the judgment circuit 20 judges that the square weighting addition value of the C0 associate calculation results or the C1 associate calculation results is the smallest, the C0 associate calculation results and the C1 associate calculation results are selected by the selection circuits 74a and 74b, and then subjected to the next addition operation. That is, the C0 associate calculation results and the components of the D0 code and the D1 code are added to each other, and the C1 associate calculation results and the component of the D2 code and the D3 code are added to each other. Furthermore, the B2 code is outputted in accordance with the present judgment signal of the low level and the last judgment signal of the high level.

According to the FIG. 20 embodiment, since the value obtained through the calculation of the codes for the next input data and the square weighting addition is judged, and the most suitable code of the data inputted before is to be outputted, it is possible to improve the problem occurs in the coding apparatus 10 shown in FIG. 4. More specifically, in a case where the square weighting addition values of the B0 associate calculation results and the B1 associate calculation results shown in FIG. 12 are almost the same value, and where the square weighting addition values of the C1 associate calculation results is the smallest in the square weighting addition values of the C0 associate calculation results to the C3 associate calculation results, since the operations for extracting the frequency components are executed with being made in chain with the B0 associate calculation results, the most suitable code is outputted from the 4-code generation circuit 22.

In addition, in order to further improve the problem included in the coding apparatus 10 shown in FIG. 4, the number of the codes in chain may be increased. In such a case, it is necessary to provide $2^M$ of addition circuits and hold circuits at the next stage included in the frequency component calculation circuits and to provide $2^{M-1}$ of switches, according to the number M of the codes in chain, and to operate the first addition circuit to the $2^M$th addition circuit such that the calculation results of the frequency components can be outputted in a chain relationship shown in FIG. 12.

Furthermore, in the above described embodiment, a code obtained by inserting "0" into the control bit and then by modulating the inserted data is regarded as the reference code, and three codes generated on the basis the reference code are regarded as the associate codes. However, it is clearly understood that the same operation becomes possible even if any one of the four kinds of codes is regarded as the reference code. Even more, the number of the bits of the code is not restricted to 25 bits.

Furthermore, though these embodiments are described with using the precoder 14 of a parallel system, the present invention is not restricted to this case, and it is clearly understood that the present invention can be applied to a case that a precoder of a serial system is used.

Although the present invention has been described and illustrated in detail, it is clearly understood that the same is by way of illustration and example only and is not to be taken by way of restriction, the spirit and scope of the present invention being limited only by the terms of the appended claims.

What is claimed:

1. A coding method, comprising the steps of:
   (a) inserting a control bit into input data of a predetermined number of bits;
   (b) generating a first code by I-NRZ modulating the input data into which said control bit has been inserted by said step (a);
   (c) generating second, third, and fourth codes in association with said first code; and
   (d) selectively outputting one of said first, second, third, and forth codes based on frequency components of said first, second, third, and fourth codes, said step (d) including the steps of:
      (d-1) extracting said frequency components of said first, second, third, and fourth codes;
      (d-2) outputting a judgement signal based on said frequency components; and
      (d-3) selecting one of said first, second, third, and fourth codes in accordance with said judgement signal.

2. A coding apparatus, comprising:
   insertion means (12) for inserting a control bit into input data of a predetermined number of bits;
   a precoder (14) which operates a first code through I-NRZ modulation of the input data into which said control bit has been inserted by said insertion means;
   associate code generation means (22, 56a, 56b, 56c) for generating second, third, and fourth codes in association with said first code based on said first code;
   frequency component extracting means (18) for extracting a plurality of frequency components of said first, second, third, and fourth codes;
   judgement means (20) for outputting a judgement signal by comparing said plurality of frequency components; and
   code outputting means (22, 54) for selectively outputting one of said first, second, third, and fourth in accordance with said judgement signal.

3. A coding apparatus according to claim 2, wherein said frequency component extraction means includes:
   first to fourth extraction means for extracting first to fourth frequency components of each of said first to fourth codes;
   first to fourth calculation means for calculating each of said first to fourth frequency components and outputting first to fifth calculation results; and
   first to fifth operation means for operating each of said first to fifth calculation results outputted from said first to fifth calculation means.

4. A coding apparatus according to claim 3, wherein each of said first to fourth extraction means includes frequency component extraction means for generating a first code, a second code and a third code on the basis of said reference code and extracting predetermined frequency components of said reference code, said first code, said second code and said third code.

5. A coding apparatus comprising:
   insertion means (12) for inserting a control bit into input data,
   a reference code generation means (14) for generating a reference code through I-NRZ modulation of data outputted from said insertion means;
   associate code generation means (22, 56a, 56b, 56c) for generating a predetermined number of associate codes in association with said reference code on the basis of said reference code;
   frequency component extracting means (18) for extracting a plurality of frequency components of said reference code and said associate codes;
   judgement signal outputting means (20) for outputting a judgement signal based on said frequency components of said reference code and said associate codes; and
   code outputting means (22,54) for selectively outputting one of said reference code and said associate codes in accordance with said judgement signal,
   wherein said frequency component extraction means includes:
      first to Nth extraction means for extracting first to Nth (N is an integer) frequency components of each of said reference code and said associate codes,
      first to Nth calculation means for calculating each of said first to Nth frequency components and outputting first to $2^M$th (M is a positive integer) calculation results; and
      first to $2^M$th operation means for operating each of said first to $2^M$th calculation results outputted from said first to Nth calculation means,
   wherein each of said first to Nth extraction means includes frequency component extraction means for generating a first code, a second code and a third code based on said reference code and extracting predetermined frequency components of said reference code, said first code, said second code and said third code, and
   wherein each of said first to Nth calculating means includes:
      first addition means for adding said frequency components of said reference code at a present time and said calculating results of said frequency components of said reference code at a last time, thereby to regard addition results as said calculation results of said first frequency component of said reference code at said present time;
      second addition means for adding said frequency components of said first code at said present time and said calculation results of said frequency components of said reference code at said last time, thereby to regard addition results as said calculation results of said first frequency component at said first code at said present time;
      third addition means for adding said frequency components of said second code at said present time and said calculation results of said frequency components of said first code at said last time, thereby to regard addition results as said calculation results of said first frequency component of said second codes at said present time;

fourth addition means for adding said frequency components of said third code at said present time and said calculation results of said frequency components of said first code at said last time, thereby to regard addition results as said calculation results of said first frequency component of said third code at said present time;

fifth addition means for adding said frequency components of said reference code at said present time and said calculation results of said frequency components of said second code at said last time, thereby to regard addition results as said calculation results of said second frequency component of said reference code at said present time;

sixth addition means for adding said frequency components of said first code at said present time and said calculation results of said frequency components of said second code at said present time, thereby to regard addition results as said calculation results of said second frequency component of said first code at said present time;

seventh addition means for adding said frequency components of said second code at said present time and said calculation results of said frequency components of said third code at said last time, thereby to regard addition results as said calculation results of said second frequency component of said second code at said present time; and eighth addition means for adding said frequency components of said third code at said present time and said calculation results of said frequency components of said third code at said last time, thereby to regard addition results as said calculation results of said second frequency component of said third code at said present time.

6. A coding apparatus according to claim 5, wherein each of said firs to Nth calculation means includes first and second adders for outputting said first and second calculation results, first setting means for operating said first adder as said first, third, fifth and seventh addition means, and second setting means for operating said second adder as said second, fourth, sixth and eighth addition means, in a case where M=1.

7. A coding apparatus according to claim 5, wherein each of said first to Nth calculation means includes first to fourth adders for outputting said first to fourth calculation results, first setting means for operating said first adder as said first and fifth addition means, second setting means for operating said second adder as said second and sixth addition means, third setting means for operating said third adder as said third and seventh addition means, and fourth setting means for operating said fourth adder as said fourth and eighth addition means, in a case where M=2.

8. A coding apparatus according to claim 5, wherein each of said first to Nth calculation means includes first to $2^M$th adders for outputting said first to $2^M$th calculation results, first setting means for operating (1+8n: n=0, 1, 2, . . . , $2^{M-3}$)th adder as first addition means, second setting means for operating (2+8n)th adder as second addition means, third setting means for operating (3+8n)th adder as third addition means, fourth setting means for operating (4+8n)th adder as fourth addition means, fifth setting means for operating (5+8n)th adder as fifth addition means, sixth setting means for operating (6+8n)th adder as sixth addition means, seventh setting means for operating (7+8n)th adder as seventh addition means, eighth setting means for operating (8+8n)th adder as eight addition means, in a case where M≥3.

9. A coding apparatus according to claim 5, wherein said reference code generation means includes replacing means (24a, 24b) for inserting predetermined one bit of said reference code at said last time instead of said control bit and for inserting predetermined one bit of said reference code at said last time instead of a first bit of said input data.

* * * * *